US011183633B2

(12) United States Patent
Sei et al.

(10) Patent No.: US 11,183,633 B2
(45) Date of Patent: Nov. 23, 2021

(54) SWITCH DEVICE, STORAGE APPARATUS, AND MEMORY SYSTEM

(71) Applicant: SONY SEMICONDUCTOR SOLUTIONS CORPORATION, Kanagawa (JP)

(72) Inventors: Hiroaki Sei, Kanagawa (JP); Kazuhiro Ohba, Tokyo (JP); Takeyuki Sone, Kanagawa (JP); Seiji Nonoguchi, Kanagawa (JP); Minoru Ikarashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/329,294

(22) PCT Filed: Sep. 12, 2017

(86) PCT No.: PCT/JP2017/032811
§ 371 (c)(1),
(2) Date: Feb. 28, 2019

(87) PCT Pub. No.: WO2018/066320
PCT Pub. Date: Apr. 12, 2018

(65) Prior Publication Data
US 2019/0252609 A1 Aug. 15, 2019

(30) Foreign Application Priority Data

Oct. 4, 2016 (JP) .............................. JP2016-196669
Jan. 20, 2017 (JP) .............................. JP2017-008138

(51) Int. Cl.
*H01L 45/00* (2006.01)
*H01L 27/24* (2006.01)
(Continued)

(52) U.S. Cl.
CPC ........ *H01L 45/141* (2013.01); *G11C 13/0011* (2013.01); *H01L 21/8239* (2013.01);
(Continued)

(58) Field of Classification Search
CPC ......... H01L 45/00–1691; H01L 27/2463–249; H01L 27/2427; H01L 45/141–144
See application file for complete search history.

(56) References Cited

U.S. PATENT DOCUMENTS

2006/0001016 A1* 1/2006 Dennison ........... G11C 13/0004
257/2
2007/0034849 A1* 2/2007 Sandoval ............ H01L 45/1233
257/2
(Continued)

FOREIGN PATENT DOCUMENTS

CN 101427396 A 5/2009
CN 107210302 A 9/2017
(Continued)

OTHER PUBLICATIONS

International Search Report and Written Opinion of PCT Application No. PCT/JP2017/032811, dated Nov. 7, 2017, 10 pages of ISRWO.

(Continued)

*Primary Examiner* — Eric A. Ward
(74) *Attorney, Agent, or Firm* — Chip Law Group

(57) ABSTRACT

A switch device includes: a first electrode; a second electrode opposed to the first electrode; and a switch layer provided between the first electrode and the second electrode, and the switch layer includes one or more kinds of chalcogen elements selected from tellurium (Te), selenium (Se), and sulfur (S) and one or more kinds of first elements selected from phosphorus (P) and arsenic (As), and further includes one or both of one or more kinds of second
(Continued)

elements selected from boron (B) and carbon (C) and one or more kinds of third elements selected from aluminum (Al), gallium (Ga), and indium (In).

19 Claims, 18 Drawing Sheets

(51) Int. Cl.
 *H01L 27/22* (2006.01)
 *H01L 21/8239* (2006.01)
 *G11C 13/00* (2006.01)
 *H01L 27/105* (2006.01)
(52) U.S. Cl.
 CPC .......... *H01L 27/105* (2013.01); *H01L 27/224* (2013.01); *H01L 27/249* (2013.01); *H01L 27/2427* (2013.01); *H01L 27/2463* (2013.01); *H01L 27/2481* (2013.01); *H01L 45/06* (2013.01); *H01L 45/08* (2013.01); *H01L 45/1233* (2013.01); *H01L 45/1266* (2013.01); *H01L 45/145* (2013.01); *H01L 45/147* (2013.01)

(56) References Cited

U.S. PATENT DOCUMENTS

| | | | |
|---|---|---|---|
| 2007/0247899 A1 | 10/2007 | Gordon et al. | |
| 2008/0042119 A1* | 2/2008 | Sandoval | H01L 45/1246 257/4 |
| 2008/0055969 A1* | 3/2008 | Liu | H01L 45/16 365/163 |
| 2009/0021977 A1* | 1/2009 | Kang | G11C 13/0004 365/163 |
| 2009/0057644 A1* | 3/2009 | Shin | H01L 27/2409 257/4 |
| 2010/0012915 A1* | 1/2010 | Yoon | H01L 45/1625 257/3 |
| 2010/0072453 A1* | 3/2010 | Jeong | H01L 45/1233 257/5 |
| 2012/0075925 A1* | 3/2012 | Lung | H01L 45/1246 365/163 |
| 2012/0181499 A1* | 7/2012 | Chuang | H01L 45/06 257/2 |
| 2013/0141967 A1* | 6/2013 | Oho | H01L 45/1233 365/163 |
| 2014/0034893 A1* | 2/2014 | Nakabayashi | H01L 45/144 257/2 |
| 2014/0117301 A1* | 5/2014 | Lim | H01L 45/144 257/4 |
| 2014/0264243 A1* | 9/2014 | Hong | H01L 45/1675 257/4 |
| 2015/0207066 A1 | 7/2015 | Ohba et al. | |
| 2016/0336378 A1 | 11/2016 | Ohba et al. | |
| 2018/0026077 A1* | 1/2018 | Wu | H01L 45/06 257/4 |

FOREIGN PATENT DOCUMENTS

| | | |
|---|---|---|
| JP | 2009-534835 A | 9/2009 |
| JP | 2012-219330 A | 11/2012 |
| KR | 10-2008-0114801 A | 12/2008 |
| KR | 10-2016-0110375 A | 9/2016 |
| TW | 200746145 A | 12/2007 |
| TW | 201535373 A | 9/2015 |
| WO | 2007/127014 A1 | 11/2007 |
| WO | 2015/107945 A1 | 7/2015 |
| WO | 2016/129306 A1 | 8/2016 |

OTHER PUBLICATIONS

Office Action for TW Patent Application No. 20170133094 dated Jan. 26, 2021.
Office Action for KR Patent Application No. 10-2019-7007735, dated Jul. 28, 2021, 05 pages of English Translation and 06 pages of Office Action.

* cited by examiner

[FIG. 1]
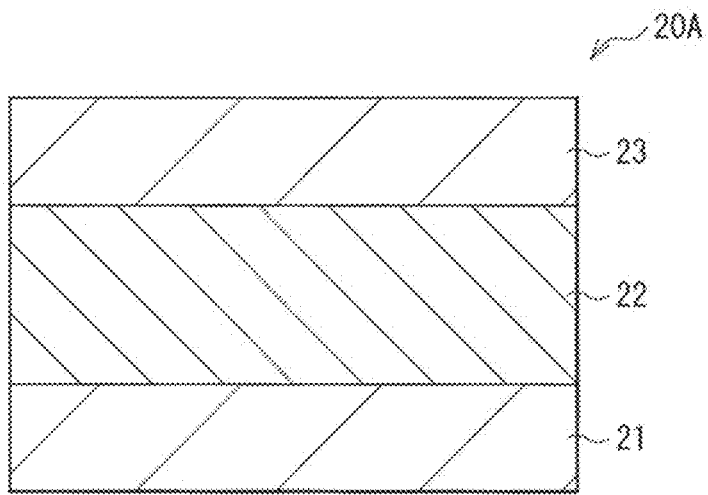
[FIG. 2]
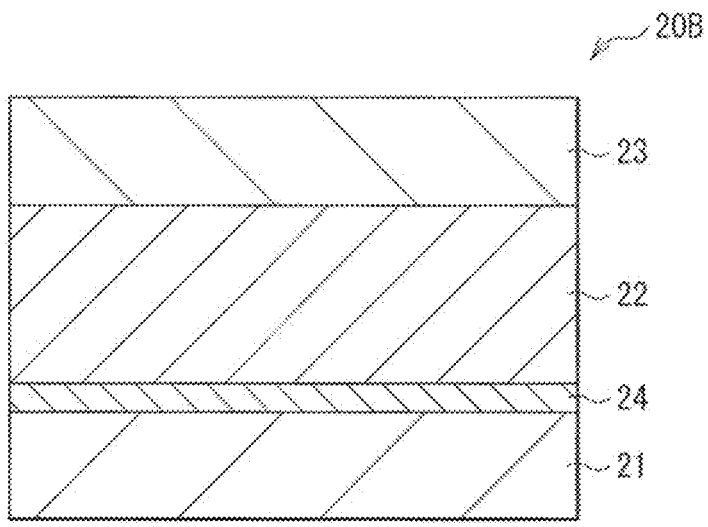

[FIG. 3]
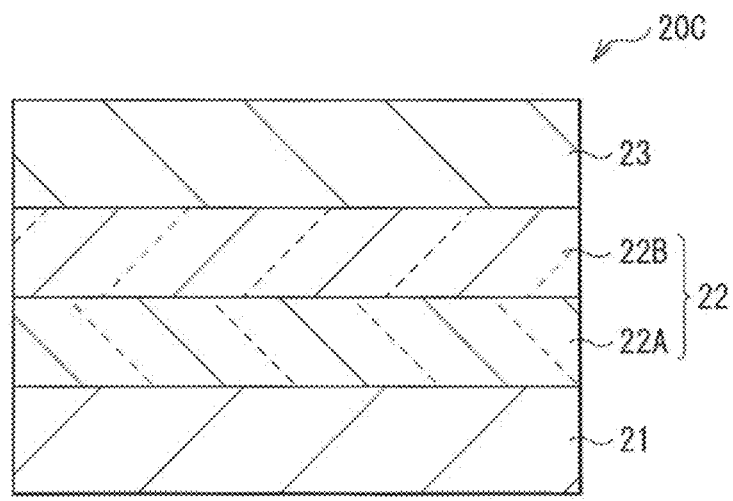
[FIG. 4]
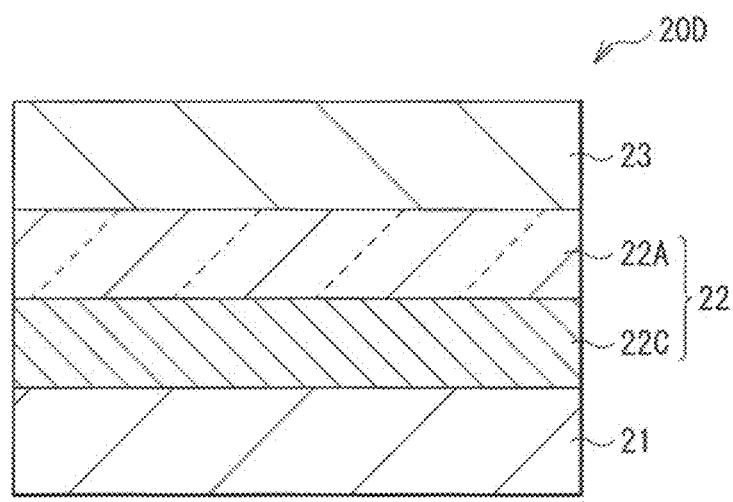

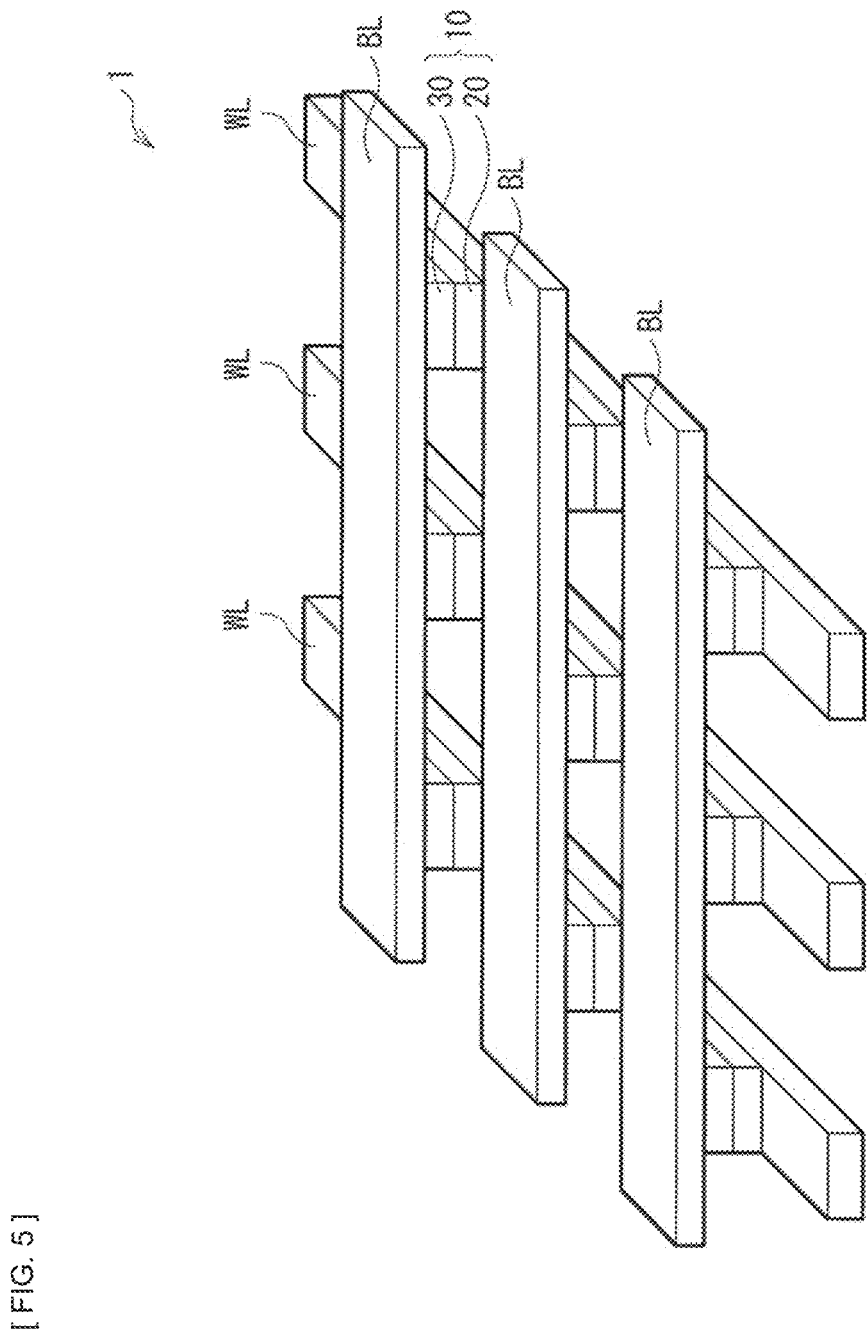
[FIG. 5]

[FIG. 6]
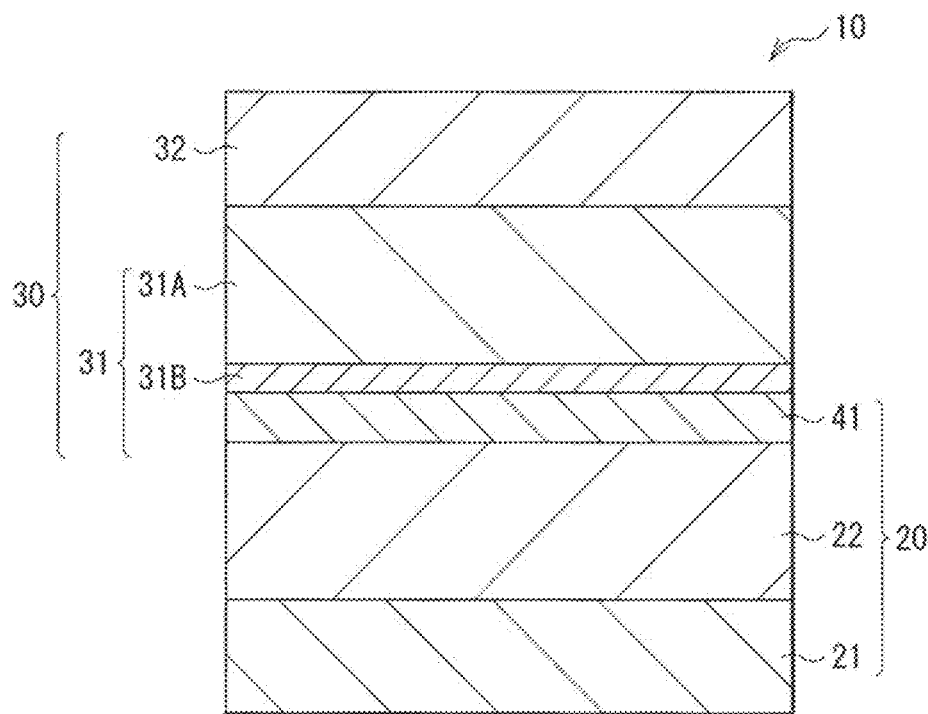
[FIG. 7]
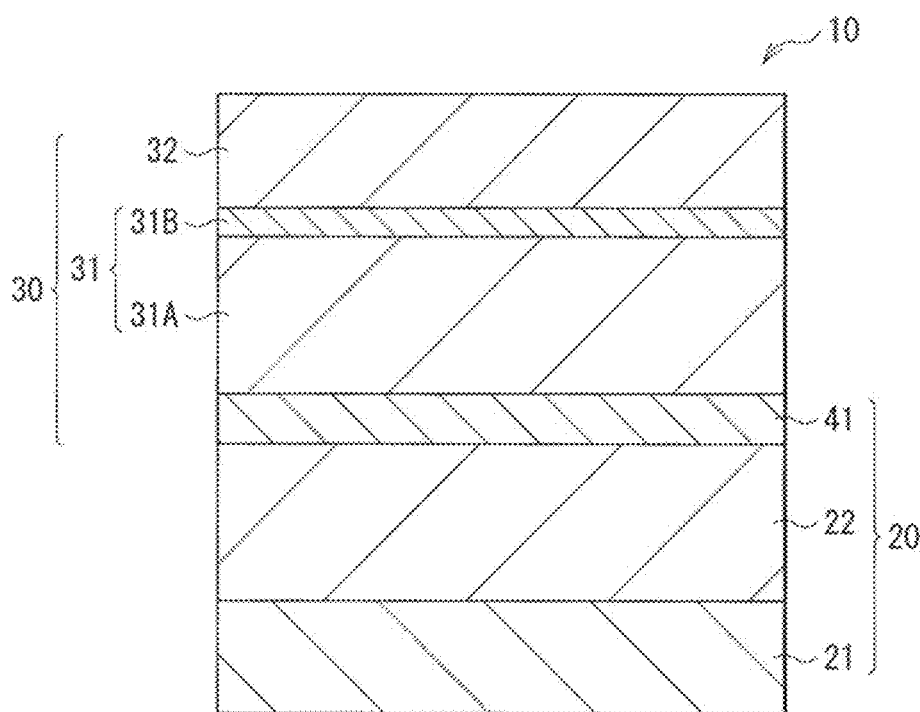

[FIG. 8]
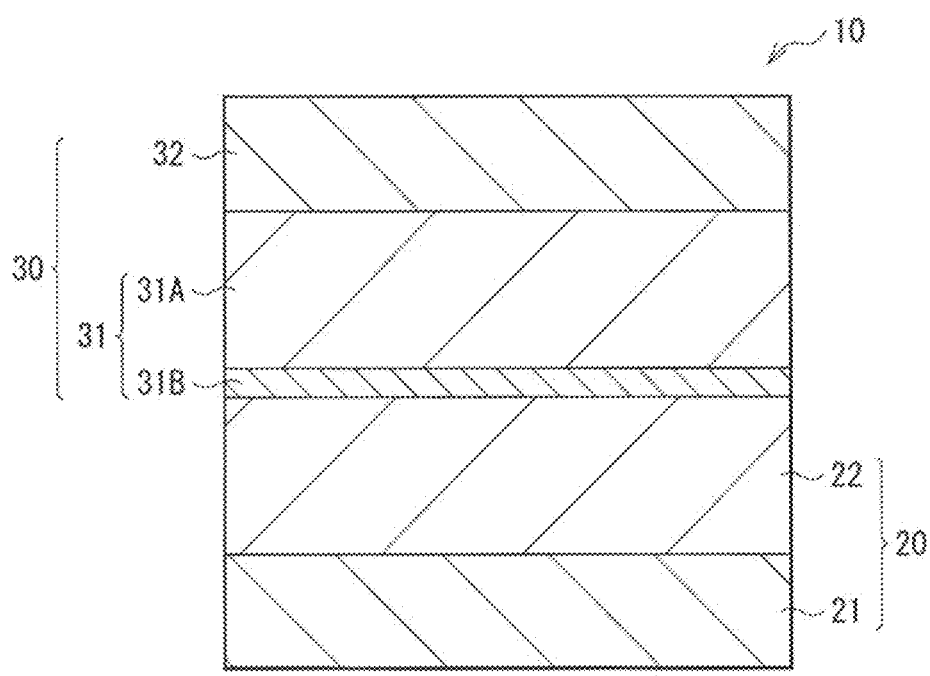

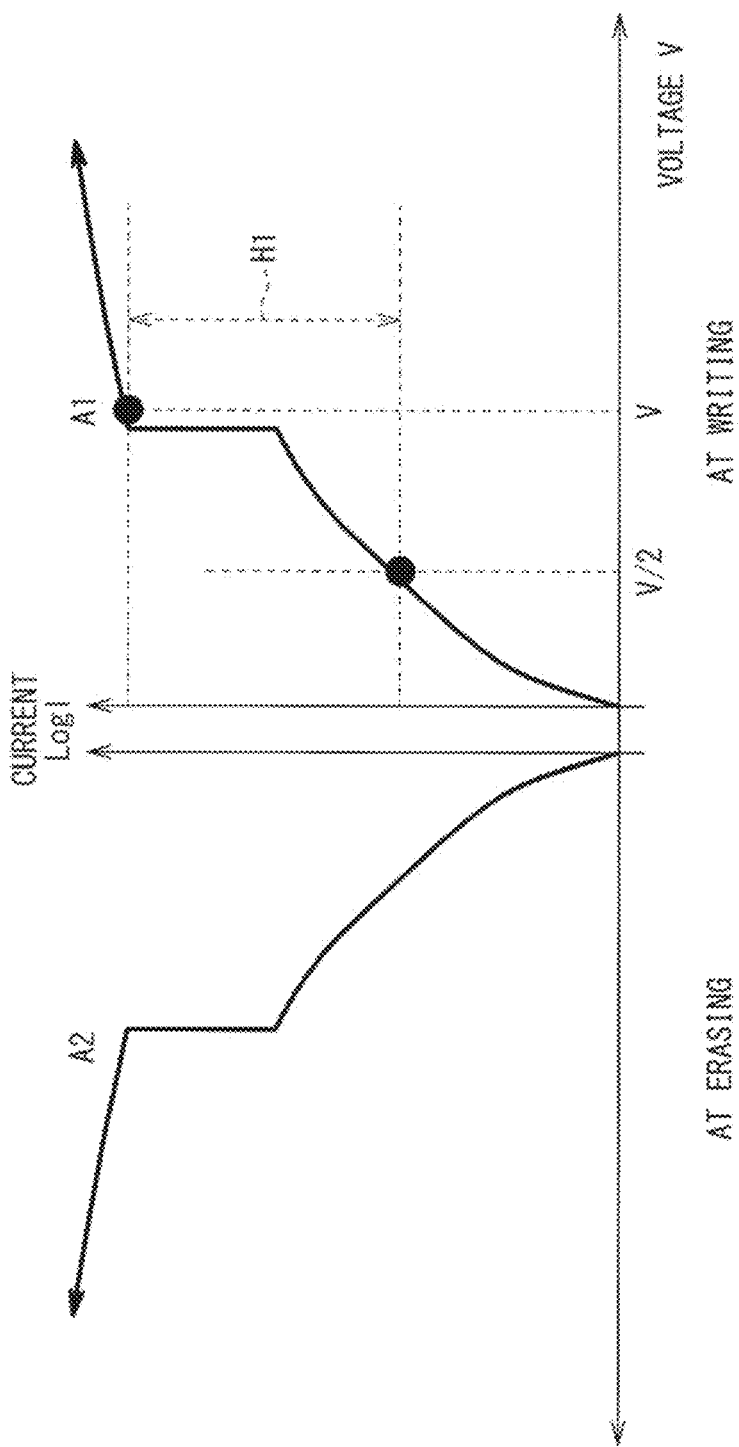
[FIG. 9]

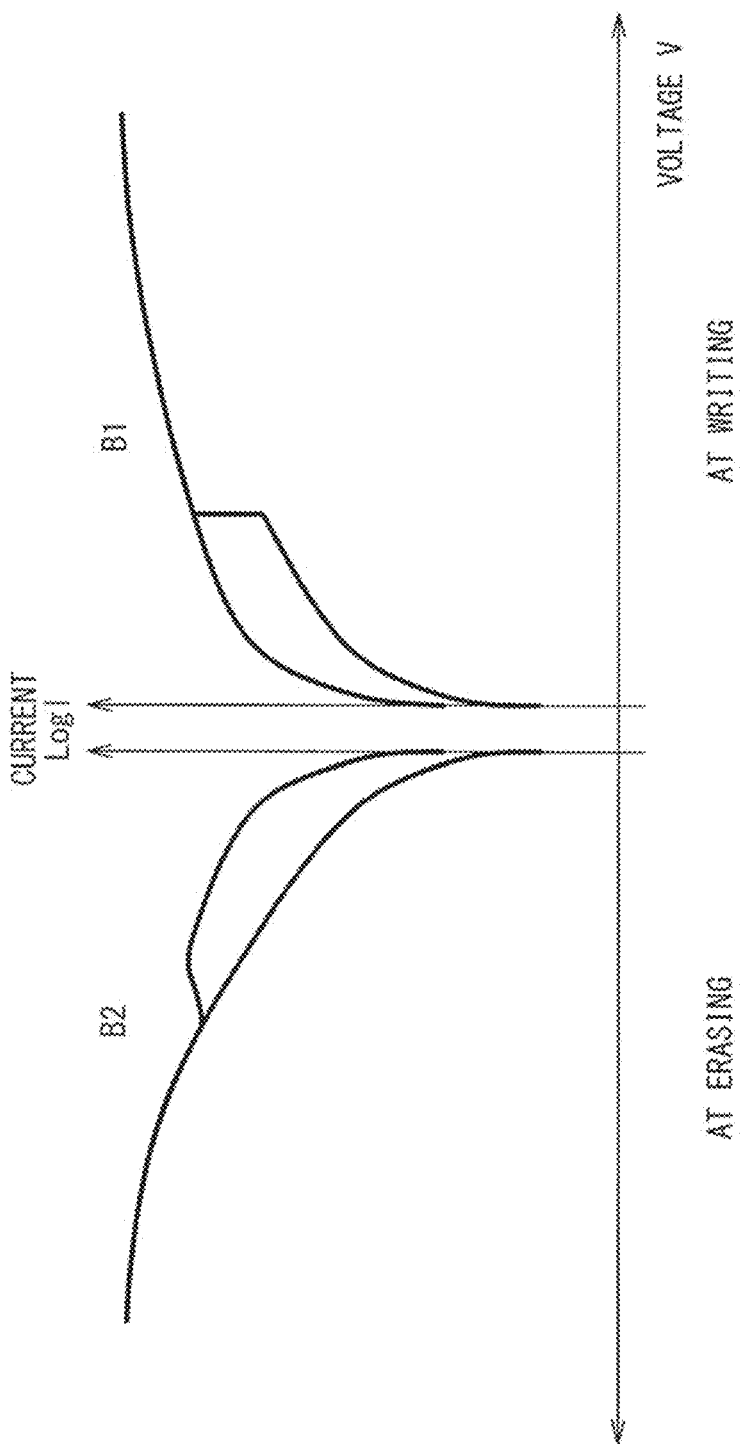
[FIG. 10]

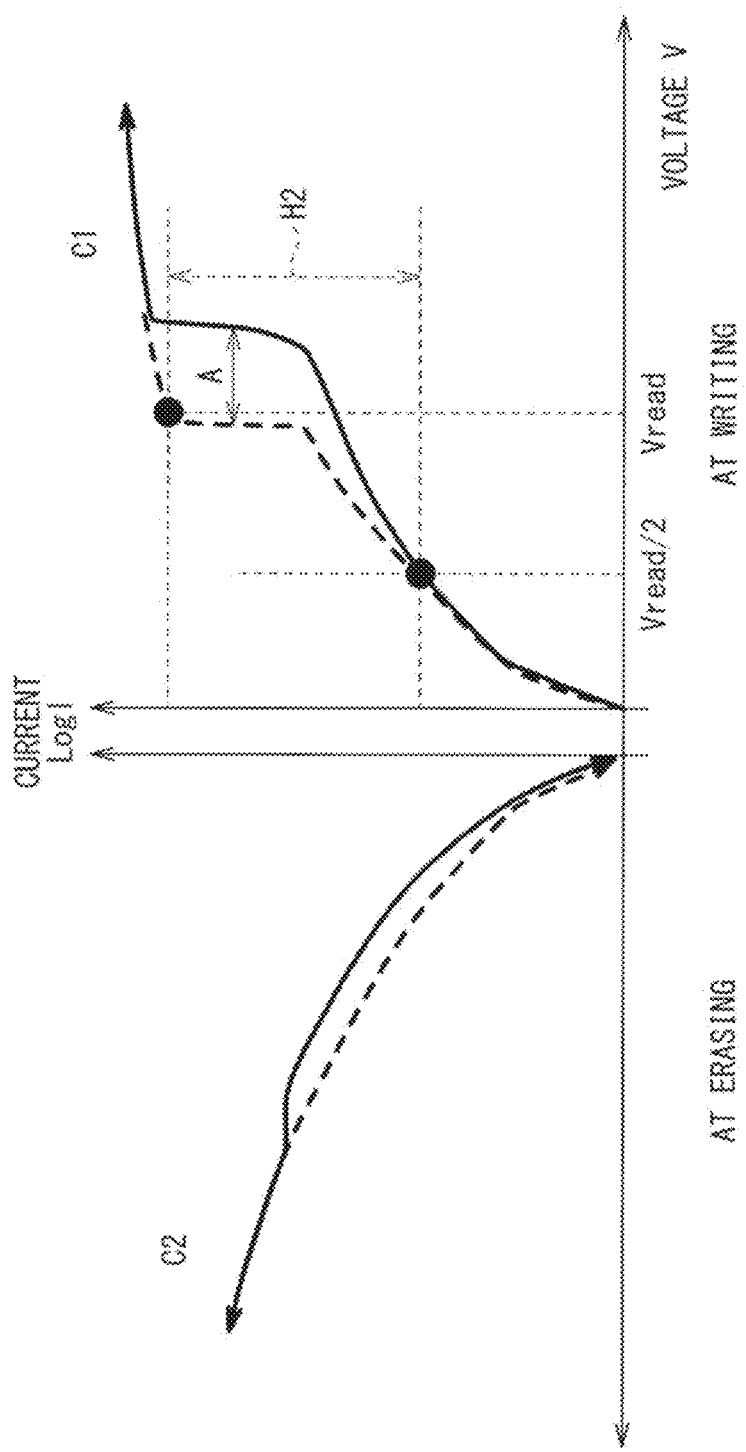
[FIG. 11]

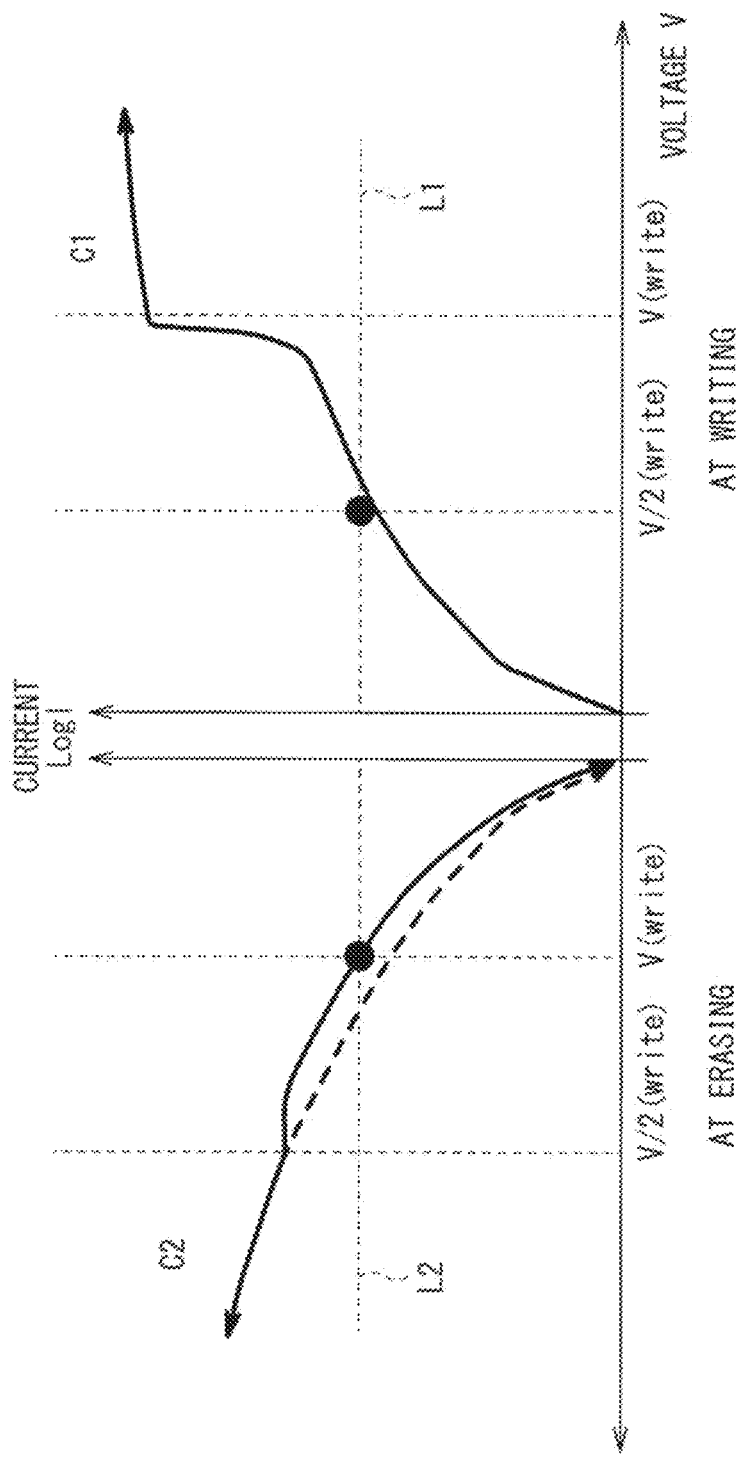
[FIG. 12]

[FIG. 13]
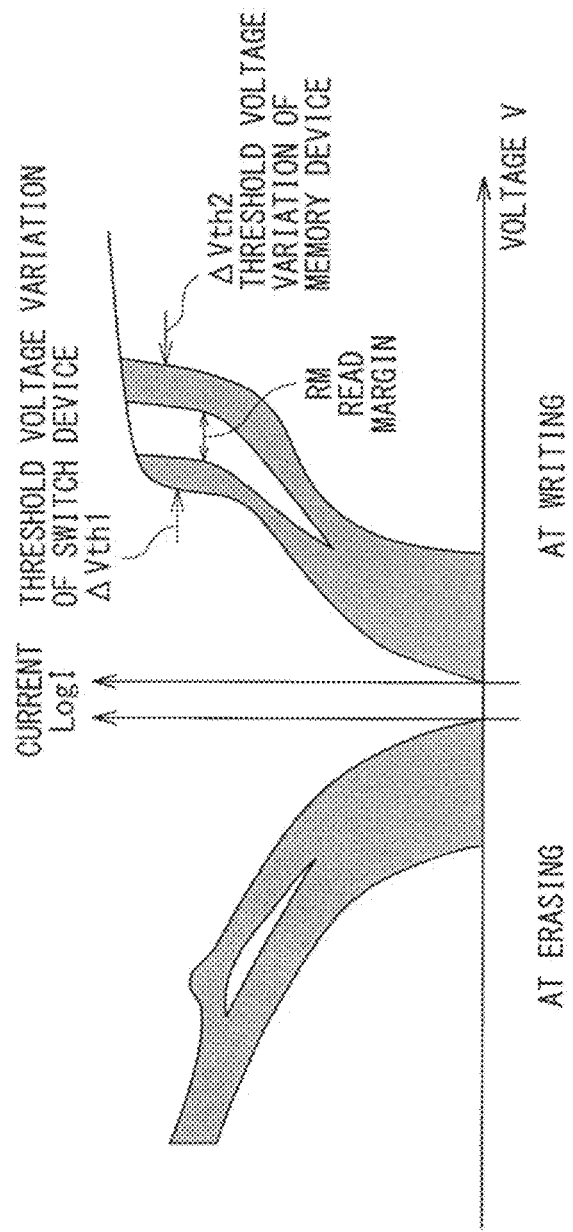

[FIG. 14]
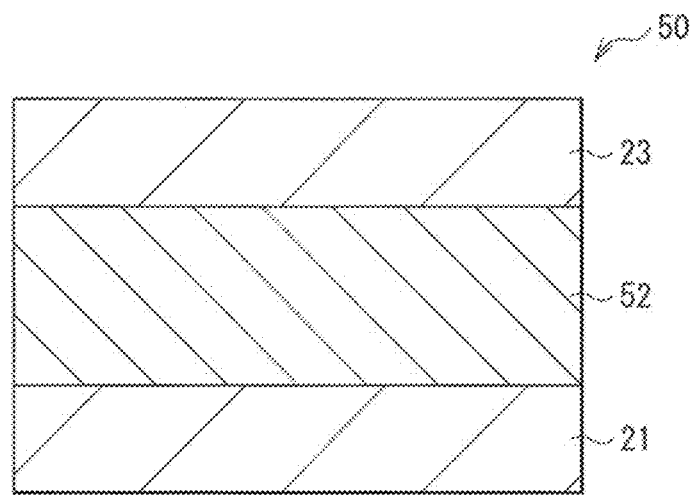
[FIG. 15]
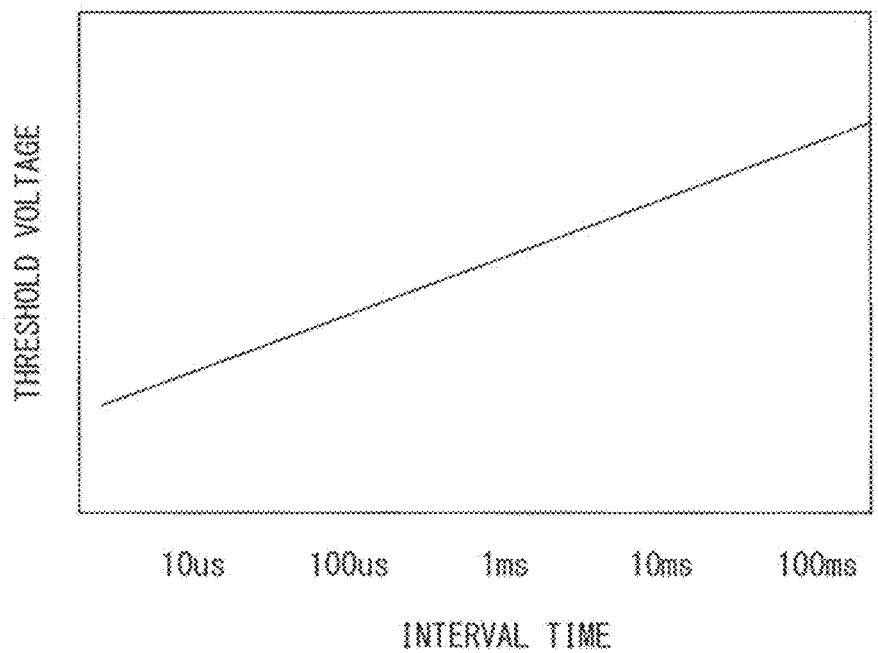

[ FIG. 16 ]
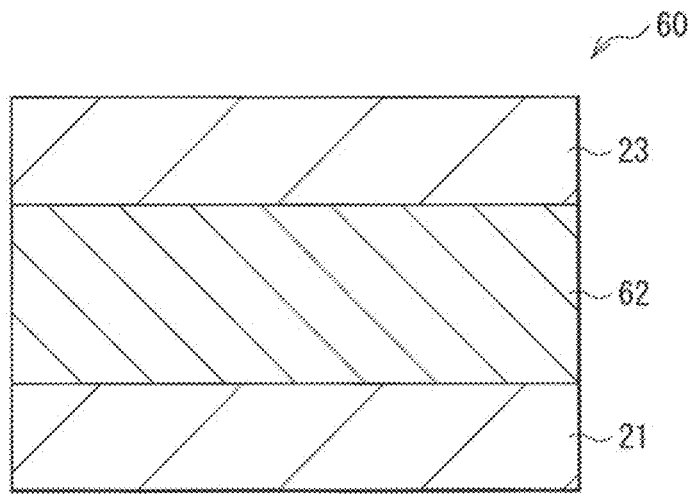

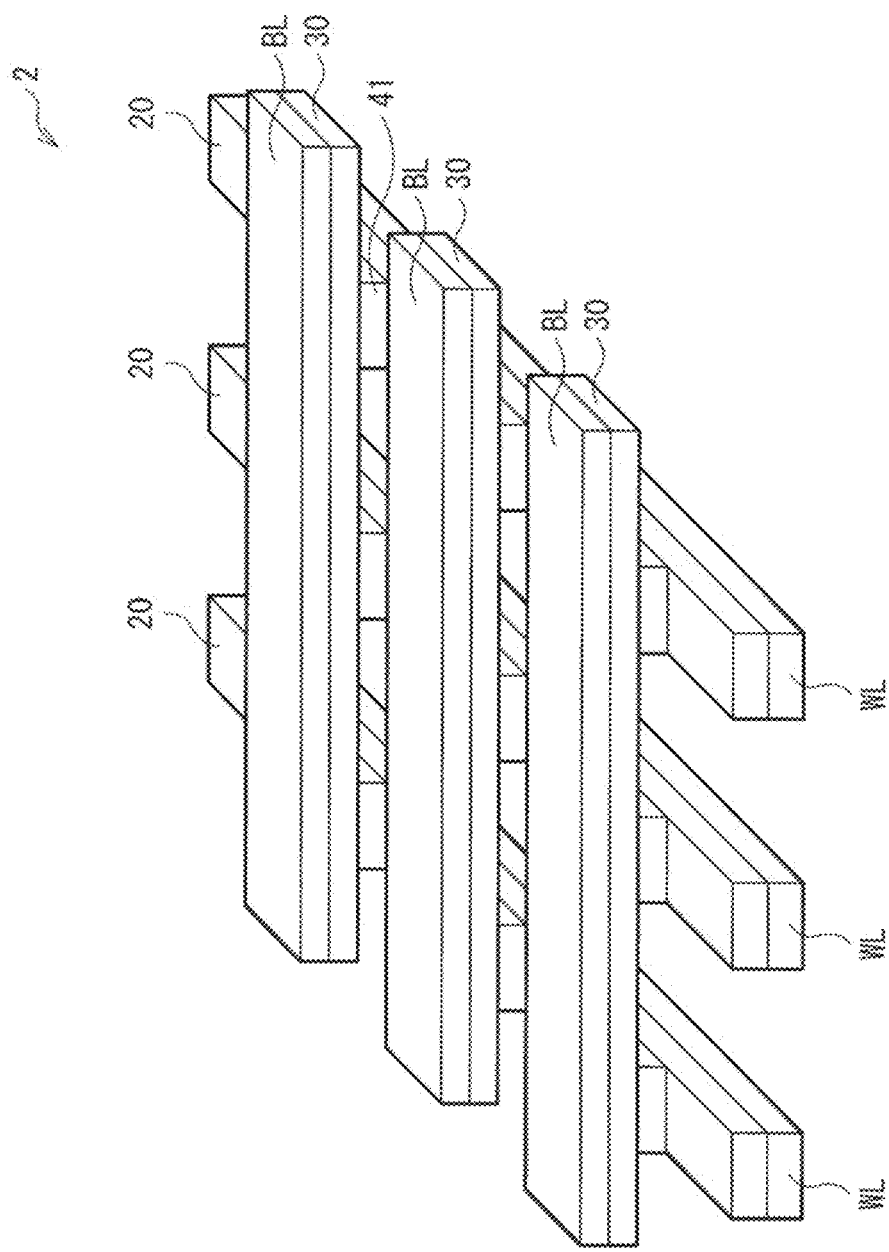
[FIG. 17]

[FIG. 18]
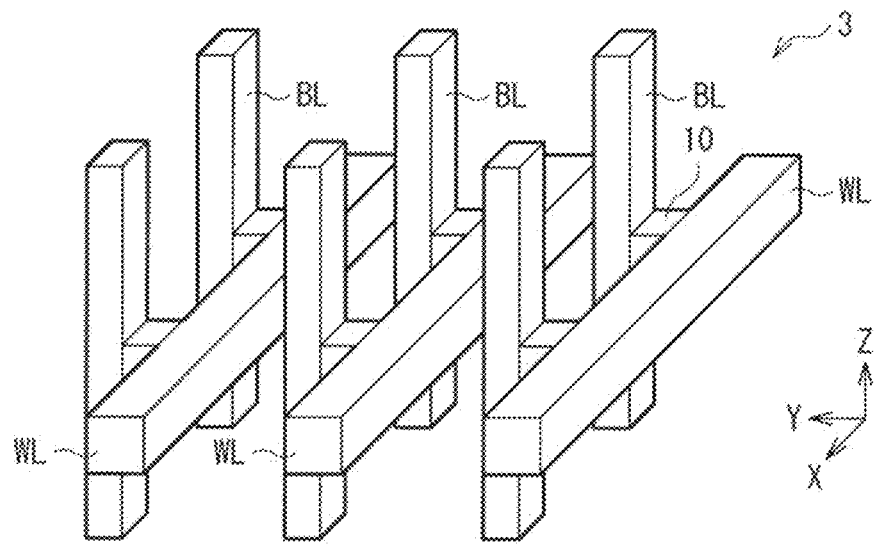
[FIG. 19]
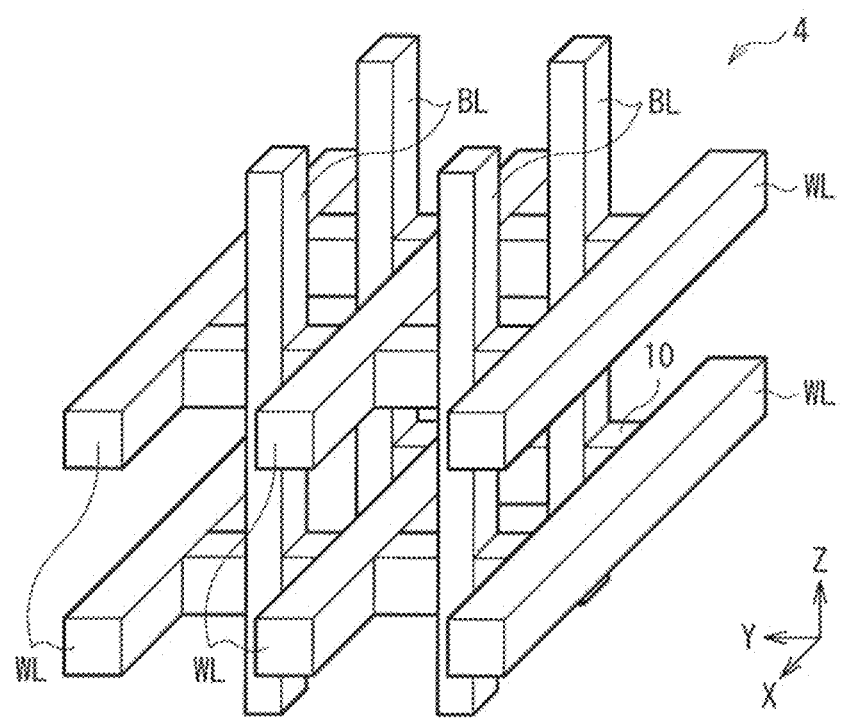

[ FIG. 20 ]
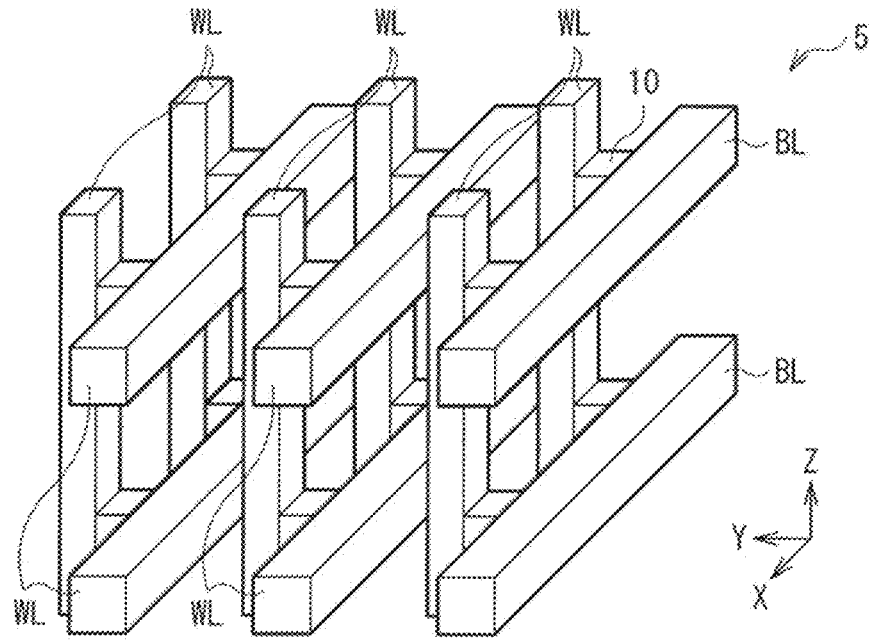
[ FIG. 21 ]
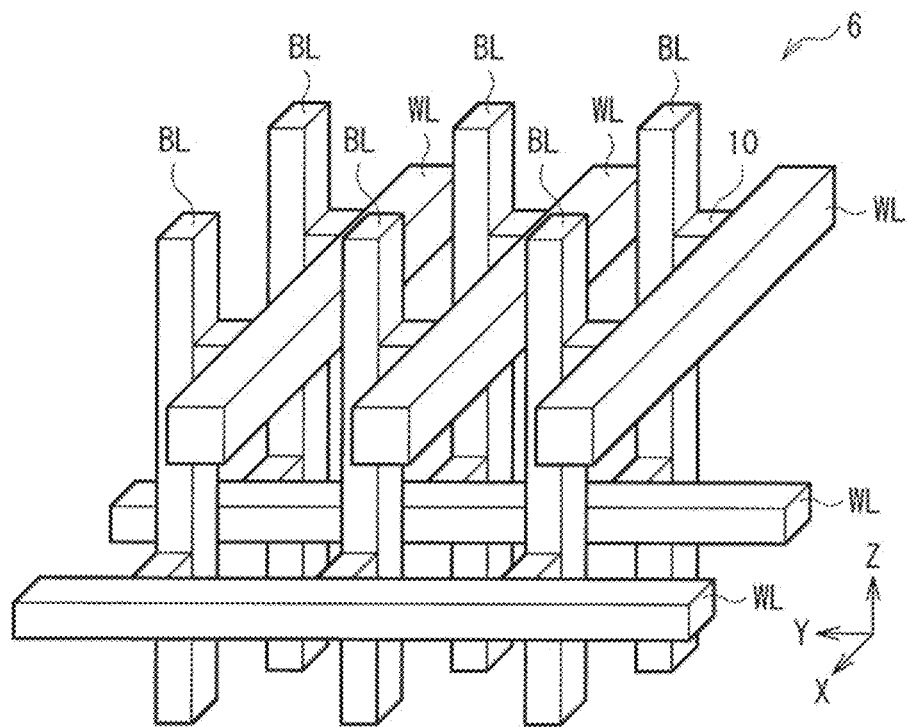

[FIG. 22]
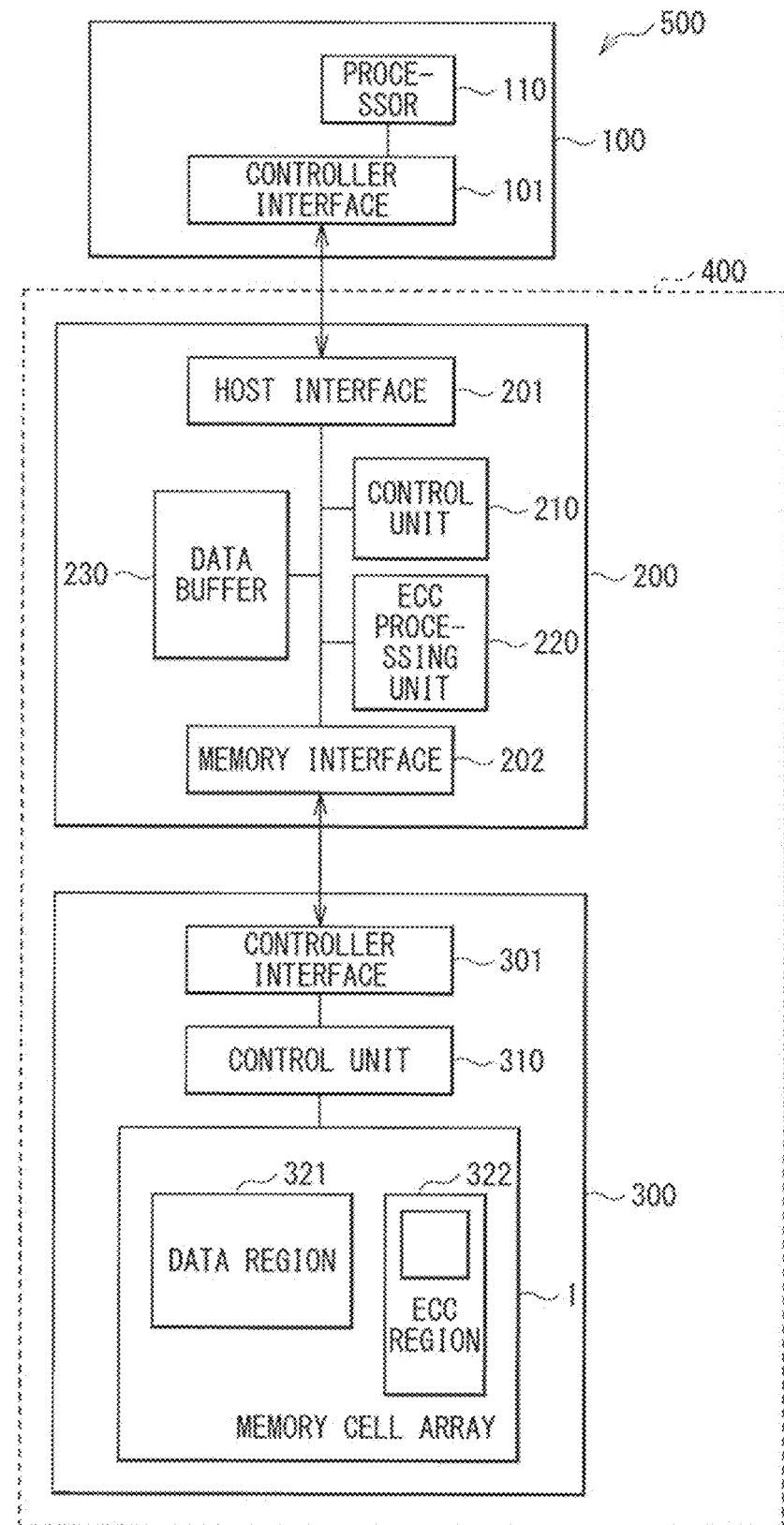

[ FIG. 23 ]
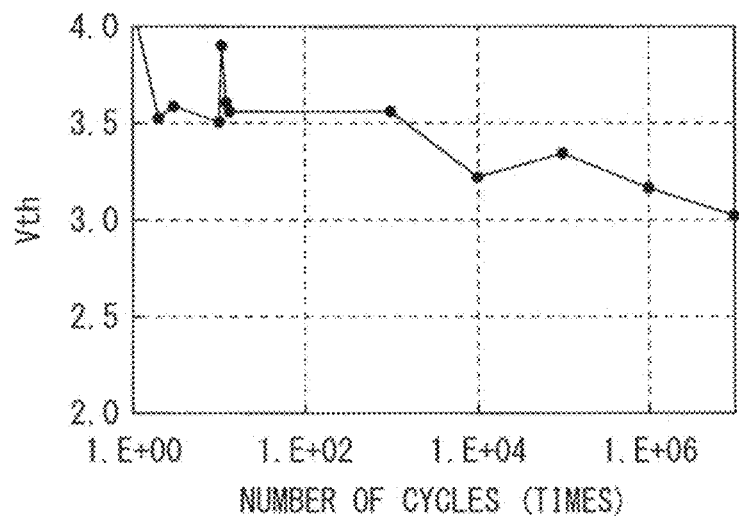
[ FIG. 24 ]
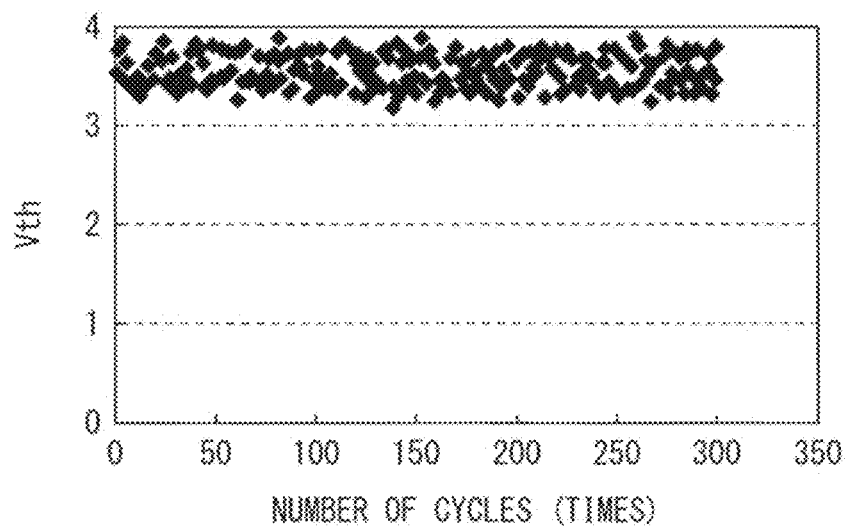

[FIG. 25]
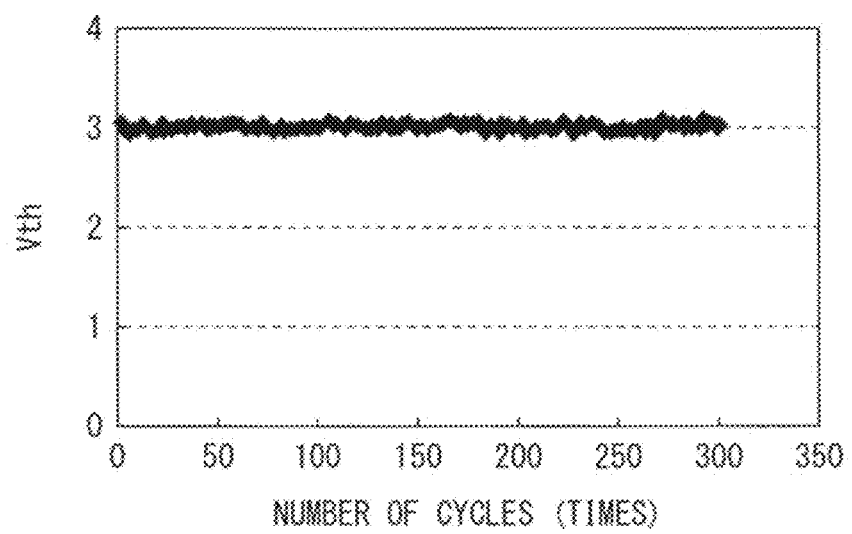

SWITCH DEVICE, STORAGE APPARATUS, AND MEMORY SYSTEM

CROSS REFERENCE TO RELATED APPLICATIONS

This application is a U.S. National Phase of International Patent Application No. PCT/JP2017/032811 filed on Sep. 12, 2017, which claims priority benefit of Japanese Patent Application No. JP 2016-196669 filed in the Japan Patent Office on Oct. 4, 2016 and also claims priority benefit of Japanese Patent Application No. JP 2017-008138 filed in the Japan Patent Office on Jan. 20, 2017. Each of the above-referenced applications is hereby incorporated herein by reference in its entirety.

TECHNICAL FIELD

The present disclosure relates to a switch device including a chalcogenide layer between electrodes, and to a storage apparatus and a memory system each of which includes the switch device.

BACKGROUND ART

In recent years, an increase in capacity is demanded for data storage non-volatile memories represented by resistance change memories such as a ReRAM (resistance random access memory) and a PRAM (Phase-Change Random Access Memory) (registered trademark). In existing resistance change memories using an access transistor, however, a floor area per unit cell is large. Therefore, the increase in capacity is not easy even if miniaturization is performed under the same design rule, as compared with, for example, flash memories such as an NAND flash memory. In contrast, in a case where a so-called cross point array structure in which a memory device is disposed at an intersection point (a cross point) of wiring lines intersecting with each other is used, the floor area per unit cell is decreased, which makes it possible to achieve the increase in capacity.

A selection device (a switch device) for cell selection is provided in addition to the memory device in a cross point memory cell. Examples of the switch device include a switch device (for example, refer to NPTLs 1 and 2) that is configured using, for example, a PN diode, an avalanche diode, or a metal oxide. In addition, the examples of the switch device further include a switch device (an ovonic threshold switch (OTS) device) using, for example, a chalcogenide material (for example, refer to PTLs 1 and 2, and NPTLs 3).

CITATION LIST

Patent Literature

PTL 1: Japanese Unexamined Patent Application Publication No. 2006-86526
PTL 2: Japanese Unexamined Patent Application Publication No. 2010-157316

Non-Patent Literature

NPTL 1: Jiun-Jia Huang et al., 2011 IEEE IEDM11-733 to 736
NPTL 2: Wootae Lee et al., 2012 IEEE VLSI Technology symposium pp.37 to 38
NPTL 3: Myoung-Jae Lee et al., 2012 IEEE IEDM 2.6.1 to 2.6.4

SUMMARY OF THE INVENTION

Incidentally, in a cross point memory cell array, in order to achieve an increase in capacity, stability of a threshold voltage of a switch device is demanded.

It is desirable to provide a switch device that makes it possible to improve stability of the threshold voltage, and a storage apparatus and a memory system each of which includes the switch device.

A switch device according to an embodiment of the present disclosure includes: a first electrode; a second electrode opposed to the first electrode; and a switch layer provided between the first electrode and the second electrode, and the switch layer includes one or more kinds of chalcogen elements selected from tellurium (Te), selenium (Se), and sulfur (S) and one or more kinds of first elements selected from phosphorus (P) and arsenic (As), and further includes one or both of one or more kinds of second elements selected from boron (B) and carbon (C) and one or more kinds of third elements selected from aluminum (Al), gallium (Ga), and indium (In).

A storage apparatus according to an embodiment of the present disclosure includes a plurality of memory cells, and each of the memory cells includes a memory device and the switch device according to the foregoing embodiment of the present disclosure directly coupled to the memory device.

A memory system according to an embodiment of the present disclosure includes: a host computer including a processor; a memory including a memory cell array that includes a plurality of memory cells, and a memory controller that performs control of a request to the memory in accordance with a command from the host computer, and each of the plurality of memory cells includes a memory device and the switch device according to the foregoing embodiment of the present disclosure directly coupled to the memory device.

In the switch device according to the embodiment of the present disclosure, the storage apparatus according to the embodiment of the present disclosure, and the memory system according to the embodiment of the present disclosure, the switch layer includes one or more kinds of chalcogen elements selected from tellurium (Te), selenium (Se), and sulfur (S), one or more kinds of first elements selected from phosphorus (P) and arsenic (As), and one or both of one or more kinds of second elements selected from boron (B) and carbon (C) and one or more kinds of third elements selected from aluminum (Al), gallium (Ga), and indium (In). This makes it possible to stabilize an amorphous structure of the switch layer and reduce fluctuations in threshold voltage.

According to the switch device according to the embodiment of the present disclosure, the storage apparatus according to the embodiment of the present disclosure, and the memory system according to the embodiment of the present disclosure, the switch layer is formed with use of the above-described elements, which stabilizes the amorphous structure of the switch layer. This makes it possible to improve stability of the threshold voltage.

It is to be noted that effects described here are not necessarily limited and may include any of effects described in the present disclosure.

BRIEF DESCRIPTION OF THE DRAWINGS

FIG. 1 is a cross-sectional view of an example of a configuration of a switch device according to a first embodiment of the present disclosure.

FIG. 2 is a cross-sectional view of another example of the configuration of the switch device according to the first embodiment of the present disclosure.

FIG. 3 is a cross-sectional view of another example of the switch device according to the first embodiment of the present disclosure.

FIG. 4 is a cross-sectional view of another example of the configuration of the switch device according to the first embodiment of the present disclosure.

FIG. 5 is a diagram illustrating an example of a schematic configuration of a memory cell array according to the first embodiment of the present disclosure.

FIG. 6 is a cross-sectional view of an example of a configuration of a memory cell illustrated in FIG. 5.

FIG. 7 is a cross-sectional view of another example of the configuration of the memory cell illustrated in FIG. 5.

FIG. 8 is a cross-sectional view of another example of the configuration of the memory cell illustrated in FIG. 5.

FIG. 9 is a diagram illustrating an example of IV characteristics in the switch device illustrated in FIG. 1.

FIG. 10 is a diagram illustrating an example of IV characteristics in a memory device illustrated in FIG. 1.

FIG. 11 is a diagram illustrating an example of IV characteristics in the memory cell illustrated in FIG. 5.

FIG. 12 is a diagram illustrating the IV characteristics in the memory cell illustrated in FIG. 5.

FIG. 13 is a diagram illustrating, in a superimposing manner, an example of IV characteristics in a typical memory cell array.

FIG. 14 is a cross-sectional view of an example of a configuration of a switch device according to a second embodiment of the present disclosure.

FIG. 15 is a characteristic diagram illustrating a relationship between an interval time and a threshold voltage for description of a drift.

FIG. 16 is a cross-sectional view of an example of a configuration of a switch device according to a third embodiment of the present disclosure.

FIG. 17 is a diagram illustrating a schematic configuration of a memory cell array according to a modification example 1 of the present disclosure.

FIG. 18 is a diagram illustrating an example of a schematic configuration of a memory cell array according to a modification example 2 of the present disclosure.

FIG. 19 is a diagram illustrating another example of the schematic configuration of the memory cell array according to the modification example 2 of the present disclosure.

FIG. 20 is a diagram illustrating another example of the schematic configuration of the memory cell array according to the modification example 2 of the present disclosure.

FIG. 21 is a diagram illustrating another example of the schematic configuration of the memory cell array according to the modification example 2 of the present disclosure.

FIG. 22 is a block diagram illustrating a configuration of a data storage system including a memory system of the present disclosure.

FIG. 23 is a characteristic diagram illustrating change in threshold voltage after each cycle in an experiment 1.

FIG. 24 is a characteristic diagram illustrating a relationship between the number of cycles and the threshold voltage in the experiment 1.

FIG. 25 is a characteristic diagram illustrating a relationship between the number of cycles and the threshold voltage in an experiment 2.

MODES FOR CARRYING OUT THE INVENTION

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, etc. of respective components illustrated in the respective drawings. It is to be noted that description is given in the following order.

1. FIRST EMBODIMENT (an example in which a switch layer includes a chalcogen element, one or more kinds of elements selected from P and As, and one or more kinds of elements selected from B and C)

1-1. Configuration of Switch Device 1-2. Configuration of Memory Cell Array 1-3. Workings and Effects

2. SECOND EMBODIMENT (an example in which a switch layer includes a chalcogen element, one or more kinds of elements selected from P and As, and one or more kinds of elements selected from Al, Ga, and In)

2-1. Configuration of Switch Device 2-2. Workings and effects

3. THIRD EMBODIMENT (an example in which a switch layer includes a chalcogen element, one or more kinds of elements selected from P and As, one or more kinds of elements selected from B and C, and one or more kinds of elements selected from Al, Ga, and In)

3-1. Configuration of Switch Device 3-2. Workings and Effects

4. MODIFICATION EXAMPLES 4-1. Modification Example 1 (another example of a memory cell array having a planar configuration)

4-2. Modification Example 2 (an example of a memory cell array having a three-dimensional configuration)

5. APPLICATION EXAMPLE (DATA STORAGE SYSTEM)

6. EXAMPLES

<1. First Embodiment>
(1-1. Configuration of Switch Device)

FIG. 1 illustrates an example of a cross-sectional configuration of a switch device (a switch device 20A) according to a first embodiment of the present disclosure. The switch device 20A selectively operates any of a plurality of storage devices (memory devices 30; FIG. 5) arranged in a memory cell array 1 having a so-called cross point array structure illustrated in FIG. 5, for example. The switch device 20A (a switch device 20; FIG. 5) is coupled in series to the memory device 30 (specifically, a memory layer 31), and includes a lower electrode 21 (a first electrode), a switch layer 22, and an upper electrode 23 (a second electrode) in this order.

The lower electrode 21 includes a wiring material used for a semiconductor process. Examples of the wiring material include tungsten (W), tungsten nitride (WN), titanium nitride (TiN), carbon (C), copper (Cu), aluminum (Al), molybdenum (Mo), tantalum (Ta), tantalum nitride (TaN), silicide, etc. It is to be noted that, for example, a single-layer film or a multilayer film in a range from 1 nm to 30 nm including W, WN, TiN, TiW, TaN, carbon (C), etc. may be formed between the lower electrode 21 and the switch layer 22. A favorable interface is thereby formed between the lower electrode 21 and the switch layer 22.

The switch layer 22 is changed to a low-resistance state by an increase in an application voltage to a predetermined threshold voltage (a switching threshold voltage) or higher, and is changed to a high-resistance state by a decrease in the application voltage to a voltage that is lower than the above-described threshold voltage (the switching threshold voltage). In other words, the switch layer 22 has negative differential resistance characteristics, and in a case where a voltage to be applied to the switch device 20A exceeds the predetermined threshold voltage (the switching threshold voltage), the switch layer 22 allows a current increased by several orders of magnitude to flow. Moreover, in the switch layer 22, an amorphous structure of the switch layer 22 is stably maintained irrespective of application of a voltage pulse or a current pulse from an unillustrated power source circuit (a pulse applicator) through the lower electrode 21 and the upper electrode 23. It is to be noted that the switch layer 22 does not perform memory operation such as retention of a conduction path formed by ion movement in response to voltage application even after the application voltage is removed.

The switch layer 22 includes an element of Group 16 in the periodic table, specifically, one or more kinds of chalcogen elements selected from tellurium (Te), selenium (Se), and sulfur (S). In the switch device 20 having an OTS (Ovonic Threshold Switch) phenomenon, the switch layer 22 desirably stably maintains an amorphous structure thereof even in a case where a voltage bias for switching is applied. It is possible to generate the OTS phenomenon stably as the amorphous structure becomes more stable. The switch layer 22 according to the present embodiment preferably includes, in addition to the above-described chalcogen elements, one or more kinds of elements (first elements) selected from phosphorus (P) and arsenic (As). The switch layer 22 further includes one or more kinds of elements (second elements) selected from boron (B) and carbon (C).

Phosphorus (P) and arsenic (As) as the first elements are easily bonded to the chalcogen elements. Accordingly, adding one or both of phosphorus (P) and arsenic (As) as a constituent element of the switch layer 22 causes the chalcogen elements in the switch layer 22 to be bonded to phosphorus (P) and arsenic (As), thereby stabilizing the amorphous structure.

In a case where an element having a relatively small atomic radius is added to an element having a relatively large atomic radius, a difference between the atomic radii of the constituent elements becomes large, and a crystal structure is not easily formed accordingly, which makes it easier to stabilize the amorphous structure. Accordingly, in a case where an element having a relatively small atomic radius such as boron (B) is added into a layer including the chalcogen element having a relatively large atomic radius such as Te as with the switch layer 22, a plurality of elements having different atomic radii are included in the layer, which stabilizes the amorphous structure.

Boron (B) has low electroconductivity among semimetals even being used alone in particular. Therefore, boron (B) is included in the switch layer 22, which increases a resistance value of the switch layer 22. In addition, boron (B) has a small atomic radius as compared with the chalcogen elements. Therefore, boron (B) is included in the switch layer 22, which stabilizes the amorphous structure of the switch layer 22 and stably develops the OTS phenomenon.

Carbon (C) makes it possible to increase resistance of the switch layer 22 in a structure other than a structure having an sp2 orbital that is observed in graphite, etc. In addition, carbon (C) has a small ionic radius as compared with the chalcogen elements, which stabilizes the amorphous structure of the switch layer 22 and stably develops the OTS phenomenon.

The switch layer 22 preferably includes the chalcogen elements, one or more kinds of first elements selected from phosphorus (P) and arsenic (As), and one or more kinds of second elements selected from boron (B) and carbon (C) in the following ranges. The chalcogen elements are preferably included in a range from 20 at % to 70 at % both inclusive. The first elements are preferably included in a range from 3 at % to 40 at % both inclusive. The second elements are preferably included in a range from 3 at % to 50 at % both inclusive.

The switch layer 22 may further include, in addition to the above-described elements, one or both of nitrogen (N) and oxygen (O). The switch layer may further include one or both of silicon (Si) or germanium (Ge). It is to be noted that in a case where the switch layer 22 includes nitrogen (N) and oxygen (O), the switch layer 22 preferably includes the first elements and the second elements in the above-described ranges with a total of composition ratios excluding nitrogen (N) and oxygen (O) being 100 at %.

Nitrogen (N) is easily bonded to boron (B), carbon (C), silicon (Si), or the like. Therefore, in the switch layer 22, nitrogen (N) and one of boron (B), carbon (C), and silicon (Si) is included in the switch layer 22, which increases the resistance value of the switch layer 22. For example, a bandgap of a-BN that is a bond of nitrogen (N) and boron (B) is 5 or more even in an amorphous state. As described above, in a case where nitrogen (N) is included in the switch layer 22, the resistance value of the switch layer 22 is larger than that in a case where nitrogen (N) is not included in the switch layer 22, thereby reducing a leakage current. In addition, diffusing a bond substance of nitrogen (N), boron (B), carbon (C), and silicon (Si) into the switch layer 22 stabilizes the amorphous structure.

The switch layer 22 is preferably formed including any one of elemental compositions of BAsTe, BAsTeN, BAsTeO, BCAsTe, BCAsTeN, BCAsTeO, BPAsTe, BPAsTeN, BPAsTeO, BCPAsTe, BCPAsTeN, BCPAsTeO, BAsSe, BAsSeN, BAsSeO, BCAsSe, BCAsSeN, BCAsSeO, BPAsSe, BPAsSeN, BPAsSeO, BCPAsSe, BCPAsSeN, and BCPAsSeO.

It is to be noted that the switch layer 22 may include any element other than these elements without impairing effects of the present disclosure.

It is possible to use a publicly known semiconductor wiring material for the upper electrode 23 as with the lower electrode 21; however, a stable material that does not react with the switch layer 22 even through post-annealing is preferable.

The switch device 20A according to the present embodiment has switch characteristics in which a resistance value thereof is high (the high-resistance state (an OFF state)) in an initial state, and becomes low (the low-resistance state (an ON state)) at a certain voltage (the switching threshold voltage) upon voltage application. Moreover, the switch device 20A is returned to the high-resistance state through decreasing the application voltage to a voltage lower than the switching threshold voltage or stopping voltage application, and is not maintained in the ON state. In other words, the switch device 20A does not perform memory operation caused by occurrence of phase change (between an amorphous phase and a crystal phase) in the switch layer 22 in response to application of a voltage pulse or a current pulse from an unillustrated power source circuit (a pulse applicator) through the lower electrode 21 and the upper electrode 23.

The switch device 20 according to the present embodiment may have the following configuration other than the configuration of the above-described switch device 20A.

A switch device 20B illustrated in FIG. 2 includes a high-resistance layer 24 between the lower electrode 21 and the switch layer 22. The high-resistance layer 24 has, for example, a higher insulation property than the switch layer 22, and includes, for example, an oxide of a metal element or a non-metal element, a nitride of a metal element or a non-metal element, or a mixture thereof. It is to be noted that FIG. 2 illustrates an example in which the high-resistance layer 24 is provided on a side on which the lower electrode 21 is located, but the high-resistance layer 24 is not limited thereto, and may be provided on a side on which the upper electrode 23 is located. Moreover, the high-resistance layer 24 may be provided on both the side on which the lower electrode 21 is located and the side on which the upper electrode 23 is located with the switch layer 22 interposed therebetween. Further, a multilayer configuration in which a plurality of switch layers 22 and a plurality of high-resistance layers 24 are stacked may be adopted.

In a switch device 20C illustrated in FIG. 3, the switch layer 22 includes the above-described elements, and is formed as a stacking structure of a first layer 22A and a second layer 22B having mutually different compositions. It is to be noted that FIG. 3, a two-layer configuration is adopted; however, three or more layers may be stacked.

In a switch device 20D illustrated in FIG. 4, the switch layer 22 is formed as a stacking structure of the first layer 22A including the above-described elements and a third layer 22C also including an element other than the above-described elements. It is to be noted that the stacking order of the first layer 22A and the third layer 22C is not particularly limited, and the third layer 22C may be provided on a side on which the upper electrode 23 is located. Moreover, the third layer 22C may include a plurality of layers that include an element other than the above-described elements and have mutually different compositions. The first layer 22A may also include a plurality of layers that include the above-described elements and have mutually different compositions. Moreover, in a case where the first layer 22A and the third layer 22C each include a plurality of layers, the layers of the first layer 22A and the layers of the third layer 22C may be alternately stacked.

(1-2. Configuration of Memory Cell Array)

FIG. 5 is a perspective view of an example of a configuration of the memory cell array 1. The memory cell array 1 corresponds to a specific example of a "storage apparatus" of the present disclosure. The memory cell array 1 has a cross-point array structure, and includes memory cells 10 each of which is provided at a position (a cross point) where each of word lines WL and each of bit lines BL are opposed to each other, as illustrated in FIG. 5, for example. In other words, the memory cell array 1 includes a plurality of word lines WL, a plurality of bit lines BL, and a plurality of memory cells 10 that are disposed at respective cross points one by one. As described above, in the memory cell array 1 according to the present embodiment is able to have a configuration in which the plurality of memory cells 10 are disposed in plane (two-dimensionally, in an XY plane direction).

The respective word lines WL extend in directions that are common to one another. The respective bit lines BL extend in directions that are different from the extending direction of the word lines WL (for example, in a direction orthogonal to the extending direction of the word lines WL), and that are common to one another. It is to be noted that the plurality of word lines WL are disposed in one or a plurality of layers. For example, the plurality of word lines WL may be disposed separately in a plurality of levels, as illustrated in FIG. 18. The plurality of bit lines BL are disposed in one or a plurality of layers. For example, the plurality of bit lines BL may be disposed separately in a plurality of levels as with the word lines WL, as illustrated in FIG. 18.

The memory cell array 1 includes the plurality of memory cells 10 that are two-dimensionally arranged on a substrate. The substrate includes, for example, a wiring group that is electrically coupled to each of the word lines WL and each of the bit lines BL, a circuit that couples the wiring group to an external circuit, and so forth. Each of the memory cells 10 includes a memory device 30 and the switch device 20 that is directly coupled to the memory device 30. Specifically, each of the memory cells 10 has a configuration in which the memory layer 31 included in the memory device 30 and the switch layer 22 included in the switch device 20 are stacked with an intermediate electrode 41 interposed therebetween. The switch device 20 corresponds to a specific example of a "switch device" of the present disclosure. The memory device 30 corresponds to a specific example of a "memory device" of the present disclosure.

The memory device 30 is disposed, for example, close to the bit line BL, and the switch device 20 is disposed, for example, close to the word line WL. It is to be noted that the memory device 30 may be disposed close to the word line WL, and the switch device 20 may be disposed close to the bit line BL. In addition, in a case where the memory device 30 is disposed close to the bit line BL and the switch device 20 is disposed close to the word line WBL in a certain layer, the memory device 30 may be disposed close to the word line WL and the switch device 20 may be disposed close to the bit line BL in a layer adjacent to the certain layer. Moreover, in each layer, the memory device 30 may be formed above the switch device 20, or inversely, the switch device 20 may be formed above the memory device 30.

(Memory Device)

FIG. 6 illustrates an example of a cross-sectional configuration of the memory cell 10 in the memory cell array 1. The memory device 30 includes a lower electrode, an upper electrode 32 that is opposed to the lower electrode, and the memory layer 31 provided between the lower electrode and the upper electrode 32. The memory layer 31 has a stacking structure in which a resistance change layer 31B and an ion source layer 31A are stacked from the lower electrode side. It is to be noted that in the present embodiment, the intermediate electrode 41 provided between the memory layer 31 included in the memory device 30 and the switch layer 22 included in the switch device 20 also serves as the lower electrode of the above-described memory device 30.

The ion source layer 31A includes movable elements that form a conduction path in the resistance change layer 31B in response to application of an electric field. Examples of the movable elements include transition metal elements, aluminum (Al), copper (Cu), and chalcogen elements. Examples of the chalcogen elements include tellurium (Te), selenium (Se), and sulfur (S). Examples of the transition metal elements include elements of Groups 4 to 6 in the periodic table such as titanium (Ti), zirconium (Zr), hafnium (Hf), vanadium (V), niobium (Nb), tantalum (Ta), chromium (Cr), molybdenum (Mo), and tungsten (W). The ion source layer 31A includes one or two or more kinds of the above-described movable elements. In addition, the ion source layer 31A may include oxygen (O), nitrogen (N), elements (such as manganese (Mn), cobalt (Co), iron (Fe), nickel (Ni), and platinum (Pt)) other than the above-described movable elements, silicon (Si), or the like.

The resistance change layer 31B includes, for example, an oxide of a metal element or a non-metal element, or a nitride of a metal element or a non-metal element. In a case where a predetermined voltage is applied between the intermediate electrode 41 and the upper electrode 32, a resistance value of the resistance change layer 31B is varied. For example, in a case where the voltage is applied between the intermediate electrode 41 and the upper electrode 32, the transition metal elements included in the ion source layer 31A move into the resistance change layer 31B to form the conduction path, which decreases the resistance of the resistance change layer 31B. In addition, a structure defect such as an oxygen defect and a nitrogen defect occurs in the resistance change layer 31B to form the conduction path, which decreases the resistance of the resistance change layer 31B. Further, the conduction path is disconnected or electroconductivity is changed by application of a voltage in a direction opposite to the direction of the voltage that is applied in a case where the resistance of the resistance change layer is decreased, which increases the resistance of the resistance change layer.

It is to be noted that the metal element and the non-metal element included in the resistance change layer 31B are not all necessarily in an oxide state, and may be partially oxidized. In addition, it is sufficient for an initial resistance value of the resistance change layer 31B to achieve a device resistance of, for example, about several MΩ to about several hundred GΩ, and a film thickness of the resistance change layer 31B may be preferably, for example, in a range from about 1 nm to about 10 nm, though an optimal value thereof is varied depending on the size of the device and the resistance value of the ion source layer.

(Switch Device)

The switch device 20 includes, for example, the switch layer 22 between the lower electrode 21 and an upper electrode, and has any of the configurations of the above-described switch devices 20A, 20B, 20C, and 20D illustrated in FIGS. 1 to 4. In addition, any of configurations of switch devices 50 and 60 to be described later is also applicable. In the present embodiment, the intermediate electrode 41 provided between the memory layer 31 included in the memory device 30 and the switch layer 22 included in the switch device 20 also serves as the above-described upper electrode. Moreover, lower electrode 21 may also serve as the bit line BL, or may be provided separately from the bit line BL. In a case where the lower electrode 21 is provided separately from the bit line BL, the lower electrode 21 is electrically coupled to the bit line BL. It is to be noted that, in the case where the switch device 20 is provided close to the word line WL, the lower electrode 21 may also serve as the word line WL, or may be provided separately from the word line WL. Here, in a case where the lower electrode 21 is provided separately from the word line WL, the lower electrode 21 is electrically coupled to the word line WL.

The intermediate electrode 41 may also serve as an electrode (for example, the upper electrode 23) of the switch device 20 or may be provided separately from the electrode of the switch device 20. The upper electrode 32 of the memory device 30 may also serve as the word line WL or the bit line BL or may be provided separately from the word line WL and the bit line BL. In a case where the upper electrode 32 is provided separately from the word line WL and the bit line BL, the upper electrode 32 is electrically coupled to the word line WL or the bit line BL. The upper electrode 32 includes a wiring material used for a semiconductor process. The upper electrode 32 may include, for example, tungsten (W), tungsten nitride (WN), titanium nitride (TiN), carbon (C), copper (Cu), aluminum (Al), molybdenum (Mo), tantalum (Ta), tantalum nitride (TaN), titanium tungsten (TiW), silicide, or the like.

The intermediate electrode 41 preferably includes, for example, a material that prevents chalcogen elements included in the switch layer 22 and the ion source layer 31A from diffusing in response to application of an electric field. This is because, for example, the ion source layer 31A includes transition metal elements as elements that allow for memory operation and retaining of a writing state, and switch characteristics may possibly be deteriorated in a case where such transition metal elements are diffused into the switch layer 22 in response to the application of the electric field. Accordingly, the intermediate electrode 41 preferably includes a barrier material having a barrier property that prevents diffusion and ion conduction of the transition metal elements. Examples of the barrier material include tungsten (W), tungsten nitride (WN), titanium nitride (TiN), carbon (C), molybdenum (Mo), tantalum (Ta), tantalum nitride (TaN), titanium tungsten (TiW), silicide, etc. The intermediate electrode 41 is formed as a single-layer film or a multilayer film using one or a plurality of kinds of the above-described materials.

Moreover, the memory cell 10 may have the following configuration other than the configuration illustrated in FIG. 6.

In the memory cell 10 illustrated in FIG. 7, the memory device 30 has a configuration in which the resistance change layer 31B is provided between the ion source layer 31A and the upper electrode 32. In the memory cell 10 illustrated in FIG. 8, the memory device has a configuration in which the intermediate electrode 41 is not provided and the switch layer 22 and the ion source layer 31A are stacked with the resistance change layer 31B interposed therebetween. It is to be noted that in the memory cells 10 illustrated in FIGS. 6 to 8, the switch device 20 has the configuration of the switch device 20A illustrated in FIG. 1 as an example; however, the switch device 20 is not limited thereto, and may have any of the configurations of the switch devices 20B, 20C, and 20D illustrated in FIGS. 2 to 4. Moreover, the switch device 20 may have any of configurations of the switch devices 50 and 60 to be described later. Further, the switch device 20 may have a configuration in which a plurality of layers of the switch device 20 and a plurality of layers of the memory device 30 are stacked alternately, for example.

Moreover, in the memory cell array 1 according to the present embodiment, the memory device 30 may have any memory form such as an OTP (One Time Programmable)

memory that uses a fuse and an anti-fuse and is writable only once, a unipolar phase change memory, and a magnetic memory using a magnetoresistive device. Examples of the unipolar phase change memory include a PCRAM.

(1-3. Workings and Effects)

As described above, in a cross point memory cell array, increasing the number of cross points makes it possible to achieve an increase in capacity. However, in a case where threshold voltage variation in the switch device disposed at each of the cross points is large, a voltage at which resistance change occurs in a memory cell including a combination of the memory device and the switch device is largely varied, and a range of a reading voltage (a read margin) between the high-resistance state and the low-resistance state of the memory cell becomes small.

Moreover, in a rewritable memory, long repetition life is demanded. Accordingly, even in the switch device included in the memory, stability with respect to a larger number of times of repetitive operation is demanded. In general, characteristics of the switch device is deteriorated as the switch device performs repetitive operation. Such deterioration in the characteristics causes a decrease or an increase in threshold voltage and threshold voltage variation among a plurality of switch devices included in the memory. Threshold voltage variation per switch device caused by the repetitive operation decreases the read margin as described above, and makes operation of the cross point memory cell array, which includes the switch devices at respective cross points, difficult. As a result, in order to achieve an increase in capacity of the cross point memory cell array, stability of the threshold voltage in the repetitive operation of the switch device is demanded.

(IV Characteristics of Memory Cell)

FIGS. 9 to 12 each illustrate a relationship between an application voltage and a value of a current flowing through an electrode at writing (for example, a forward bias) and at erasing (for example, a reverse bias) of the memory cell 10. A solid line indicates IV characteristics during voltage application, and a dashed line indicates IV characteristics in a case where the application voltage is swept in a decreasing direction.

FIG. 9 illustrates IV characteristics of the switch device 20. Upon application of the forward bias (in this case, a writing voltage) to the switch device 20, the current is increased in the switch device 20 along with an increase in the application voltage. In a case where the application voltage exceeds a predetermined threshold voltage (a switching threshold voltage), the current is drastically increased, or the resistance is decreased by the OTS operation, thereby putting the switch device 20 into an ON state. Thereafter, in a case where the application voltage is decreased, the value of the current flowing through the electrode of the switch device 20 is gradually decreased. For example, the resistance is drastically increased at the threshold voltage that is substantially equal to the threshold voltage in increasing, and the switch device 20 is accordingly putting into an OFF state, depending on the materials and the formation condition of the switch device 20. It is to be noted that H1 in FIG. 9 denotes a selection ratio of the switch device 20.

FIG. 10 illustrates IV characteristics of the memory device 30. As can be seen from FIG. 10, the value of the current is increased in the memory device 30 along with an increase in the application voltage. Writing operation is performed, at a certain threshold voltage, through formation of the conduction path in the resistance change layer of the memory layer 31, thus changing the memory layer 31 to the low-resistance state and increasing the current. In other words, the memory device 30 is changed to the low-resistance state in response to the application of the writing voltage, and the low-resistance state is maintained even after the voltage application is stopped.

FIG. 11 illustrates the IV characteristics of the memory cell 10. A switching behavior of the current value of the memory cell 10 at application start and application stop of the writing voltage becomes an IV curve C1 in FIG. 11, which is a combination of an IV curve A1 of the switch device 20 and an IV curve B1 of the memory device 30. In such a memory cell 10, for example, in a V/2 bias system, a reading voltage (Vread) of the memory cell 10 is set to a voltage between voltages at two points at which resistance is steeply changed, on the IV curve C1 (a range indicated by an arrow A in FIG. 11), and Vread/2 is set to a voltage half of the reading voltage Vread. This makes a selection ratio that is defined by a current ratio of the Vread bias and Vread/2 bias (an ON/OFF ratio) larger. In addition, since the IV curve C1 of the memory cell 10 is a combination of the IV curve A1 of the switch device 20 and the IV curve B1 of the memory device 30 as described above, the selection ratio (the ON/OFF ratio) becomes larger as resistance variation (or current variation) before and after the threshold of the switch device 20 is larger. In addition, the read margin becomes larger as the selection ratio is larger, which makes it possible to increase a cross point array size without erroneous reading and to further increase the capacity of the memory cell array 1.

This applies not only to reading operation but also to the writing operation. FIG. 12 illustrates the IV characteristics of the memory cell 10 similarly to FIG. 11. As described above, in the cross point array, a large number of bits are coupled to the bit line BL or the word line WL that is the same as that of the target memory cell 10. Therefore, as illustrated in FIG. 12, erroneous writing may possibly occur in the non-selected memory cell 10 if a leakage current biased to Vwrite/2 in a non-selected state, which is denoted by a cross point of Vwrite/2 and an IV loop of the dashed line of the IV curve C1 in a Set state, is large. Therefore, in the writing operation, it is necessary to reduce the leakage current to the extent that does not cause the erroneous writing of the non-selected memory cell 10 biased to Vwrite/2, while a writing voltage Vwrite is set to a voltage that provides a current necessary for writing of the memory device 30. In other words, it is possible to operate the large-sized cross point array without involving the erroneous writing, as the leakage current biased to Vwrite/2 in the non-selected state is smaller. Accordingly, increasing the ON/OFF ratio of the switch device 20 also during the writing operation leads to an increase in capacity of the memory cell array 1.

On the other hand, in a case where the reverse bias (herein, an erasing voltage) is applied, the variation of the current value of the switch device 20 during application of the erasing voltage exhibits a behavior similar to that during the application of the writing voltage (an IV curve A2 in FIG. 9). In contrast, the current value of the memory device 30 during the application of the erasing voltage is varied from the low-resistance state to the high-resistance state by application of a voltage higher than an erasing threshold voltage (an IV curve B2 in FIG. 10). Further, the variation of the current value of the memory cell 10 during the application of the erasing voltage becomes a combination of the IV curve A2 of the switch device 20 and the IV curve B2 of the memory device 30, as with the variation of the current value during the application of the writing voltage (an IV curve C2 in FIG. 11 or FIG. 12).

It is to be noted that, in the V/2 bias system, the leakage current at the erasing with Vreset/2 bias becomes an issue even in a case where a reading bias is set to a writing side, for example. In other words, in a case where the leakage current is large, unintentional erroneous erasing may possibly occur. Therefore, as with a case of applying a positive bias, an increase in size of the cross point array is achieved more advantageously as the ON/OFF ratio of the switch device 20 becomes higher and as the leakage current in the OFF state becomes smaller. In other words, this leads to an increase in capacity of the memory cell array 1.

Incidentally, as can be seen from FIGS. 9 to 12, even in a case where the erasing voltage is applied, the switch device 20, the memory device 30, and the memory cell 10 each have an IV curve similar to that in a case where the writing voltage is applied. In other words, the switch device 20, the memory device 30, and the memory cell 10 each have bidirectional characteristics. The IV characteristics of each of the switch device 20, the memory device 30, and the memory cell 10, in fact, involve variation for each device. Therefore, the plurality of (for example, 120) memory cells 10 included in the memory cell array 1 have threshold voltage variation as schematically illustrated in FIG. 13, for example. It is to be noted that a black-colored region in FIG. 13 denotes that the IV curve for each device involves the variation.

In the IV characteristics at the writing in FIG. 13, steep change in the current value in an IV curve on the right side indicates a state in which the memory device 30 is switched from the OFF state to the ON state while the switch device 20 is in the ON state. In other words, ΔVth2 indicates threshold voltage variation of the memory device 30. Moreover, in the IV characteristics at the writing in FIG. 13, steep change in the current value in an IV curve on the left side indicates a state in which the switch device 20 is returned from the ON state to the OFF state while the memory device 30 is in the ON state. In other words, ΔVth1 indicates threshold voltage variation of the switch device 20. In the IV characteristics at the writing in FIG. 13, a gap between the IV curve on the right side and the IV curve on the left side corresponds to a read margin RM. In other words, it is found that the read margin RM in the memory cell array becomes narrower as ΔVth1 and ΔVth2 are larger.

As described above, stability of the threshold voltage in the repetitive operation of the switch device is important for an increase in capacity of the cross point memory cell array. However, in a switch device using a chalcogenide material, in general, threshold voltage variation and deterioration in characteristics caused by repetitive operation are recognized as issues. For example, in NPTL 3 described above, a switch device that includes a switch layer including SiGeAsTe is exemplified; however, in this switch device, at a threshold voltage of about 1.2 V, variation by about 40% of the value of the threshold voltage is recognized.

In contrast, in a switch device including a BCTeN material in an experiment 1-1 of examples to be described later, the threshold voltage is about 3.5 V that is large, which makes it possible even for a resistance change memory device having a writing voltage of about 2.5 V to be sufficiently operated. Moreover, it is possible to relatively suppress threshold voltage variation, which makes it easy to secure an operation window. However, it has been confirmed that this switch device has a tendency that the threshold voltage is decreased by deterioration etc. in a case where the switch device performs repetitive operation.

In contrast, in the switch device 20 according to the present embodiment, the switch layer 22 includes one or more kinds of chalcogen elements selected from tellurium (Te), selenium (Se), and sulfur (S), one or more kinds of first elements selected from phosphorus (P) and arsenic (As), and one or more kinds of second elements selected from boron (B) and carbon (C). This leads to a stable amorphous structure of the switch layer 22, reduction in fluctuations in the threshold voltage caused by the repetitive operation, and reduction in variation. In other words, this make it possible to improve stability of the threshold voltage in the repetitive operation.

As described above, in the switch device 20 according to the present embodiment, the switch layer 22 includes the chalcogen elements, at least one or more kinds of elements selected from phosphorus (P) and arsenic (As), and one or more kinds of elements selected from boron (B) and carbon (C), which allows for an improvement in stability of the threshold voltage in the repetitive operation. Accordingly, it is possible to achieve an increase in capacity and an increase in life of the cross point memory cell array.

Next, description is given of a second embodiment, a third embodiment, and modification examples of the present disclosure. In the following, components similar to those of the foregoing first embodiment are denoted by same reference numerals, and description thereof is omitted where appropriate.

<2. Second Embodiment>
(2-1 Configuration of Switch Device)

FIG. 14 illustrates an example of a cross-sectional configuration of a switch device (a switch device 50) according to the second embodiment of the present disclosure. The switch device 50 selectively operates any of a plurality of storage devices (memory devices 30) arranged in the memory cell array 1 having a so-called cross point array structure illustrated in FIG. 5, for example, as with the switch device 20 (or 20A, 20B, 20C, or 20D) according to the foregoing first embodiment. The switch device 50 includes the lower electrode 21 (the first electrode), a switch layer 52, and the upper electrode 23 (the second electrode) in this order.

The lower electrode 21 and the upper electrode 23 each include any of the materials described in the foregoing first embodiment. Examples of the materials include tungsten (W), tungsten nitride (WN), titanium nitride (TiN), carbon (C), copper (Cu), aluminum (Al), molybdenum (Mo), tantalum (Ta), tantalum nitride (TaN), silicide, etc. It is to be noted that a single layer film or a multilayer film in a range from 1 nm to 30 nm including W, WN, TiN, TiW, TaN, carbon (C), etc. may be formed between the lower electrode 21 and the switch layer 52. This causes a favorable interface to be formed between the lower electrode 21 and the switch layer 52.

The switch layer 52 includes an element of Group 16 in the periodic table, specifically, one or more kinds of chalcogen elements selected from tellurium (Te), selenium (Se), and sulfur (S), as with the switch layer 22 according to the foregoing first embodiment. In the switch device 20 having the OTS phenomenon, it is necessary for the switch layer 52 to stably maintain an amorphous structure thereof even in a case where a voltage bias for switching is applied. It is possible to generate the OTS phenomenon stably as the amorphous structure becomes more stable. The switch layer 52 includes, in addition to the above-described chalcogen elements, one or more kinds of elements (first elements) selected from phosphorus (P) and arsenic (As). The switch layer 52 further includes one or more kinds of elements (third elements) selected from aluminum (Al), gallium (Ga), and indium (In).

Elements of Group 13 such as gallium (Ga) in the periodic table excluding boron (B) form, for example, a stable compound such as GaTe and $Ga_2Te_3$ with the chalcogen elements. Gallium (Ga) forms a stable compound such as GaP and GaAs with phosphorus (P) and arsenic (As). Phosphorus (P) and arsenic (As) are easily bonded to the chalcogen elements. Accordingly, the elements of Group 13 such as gallium (Ga) in the periodic table excluding B are bonded to phosphorus (P) and arsenic (As), thereby easily taking an amorphous structure.

The switch layer 52 preferably includes the chalcogen elements, one or more kinds of first elements selected from phosphorus (P) and arsenic (As), and one or more kinds of third elements selected from aluminum (Al), gallium (Ga), and indium (In) in the following ranges. The chalcogen elements are preferably included in a range from 20 at % to 70 at % both inclusive. The first elements are preferably included in a range from 3 at % to 40 at % both inclusive. The third elements are preferably included in a range from 3 at % to 40 at % both inclusive.

The switch layer 22 may further include, in addition to the above-described elements, one or both of nitrogen (N) and oxygen (O). Nitrogen (N) is bonded to aluminum (Al) and gallium (Ga) to form a compound having high resistance. It is to be noted that in a case where the switch layer 22 includes nitrogen (N) and oxygen (O), the switch layer 22 preferably includes the chalcogen elements, the first elements and the third elements in the above-described ranges with a total of composition ratios excluding nitrogen (N) and oxygen (O) being 100 at %.

The switch layer 22 is preferably formed including any one of elemental compositions of GaPTe, GaPSe, GaPTeO, GaPSeO, GaPTeN, GaPSeN, AlAsTe, AlAsSe, GaAsTe, GaAsSe, AlAsTeO, AlAsSeO, GaAsTeO, GaAsSeO, AlAsTeN, AlAsSeN, GaAsTeN, and GaAsSeN.

Moreover, the switch layer 52 may include one or both of silicon (Si) and germanium (Ge). In a case where the switch layer 52 includes silicon (Si), germanium (Ge), or the like, nitrogen (N) is also bonded to these elements to form a compound having high resistance. In other words, configuring the switch layer 52 with use of the third elements such as aluminum (Al) and gallium (Ga), silicon (Si) or germanium (Ge), and nitrogen (N) makes it possible to form the switch layer 52 having a high resistance value. For example, a bandgap of a compound of nitrogen (N) and aluminum (Al) is around 6.2. This reduces generation of a leakage current, as compared with a case where nitrogen (N) is not included. In the switch layer 52 including the third elements such as aluminum (Al) and gallium (Ga), silicon (Si) or germanium (Ge), and nitrogen (N), a compound in which these elements are bonded to one another is diffused into a layer, thereby stabilizing the amorphous structure.

For example, the switch layer 22 is preferably formed including any one of elemental compositions of GaGeAsTe, GaGeAsSe, GaGeAsTeO, GaGeAsSeO, GaGeAsTeN, GaGeAsSeN, GaSiAsTe, GaSiAsSe, GaSiAsTeO, GaSiAsSeO, GaSiAsTeN, and GaSiAsSeN.

The switch layer 52 more preferably include, for example, the elemental composition of GaGeAsSeN among the above-described elemental compositions. Composition ratios of the respective elements in this elemental composition are preferably in the following ranges in a state in which nitrogen (N) is excluded. The composition ratio of selenium (Se) as the chalcogen element is preferably in a range from 40 at % to 60 at % both inclusive. The composition ratio of arsenic (As) as the first element is preferably in a range from 20 at % to 40 at % both inclusive. The composition ratio of gallium (Ga) as the third element is preferably in a range from 3 at % to 10 at % both inclusive. Moreover, the composition ratio of germanium (Ge) is preferably in a range from 5 at % to 15 at % both inclusive. An additive amount of nitrogen (N) is preferably in a range from 5 at % to 20 at % both inclusive with respect to all the constituent elements.

In the above-described elemental composition, in a case where the composition ratio of arsenic (As) as the first element is larger than the above-described range, stability of the amorphous structure is decreased, and heat resistance is slightly decreased. In a case where the composition ratio of arsenic (As) as the first element is smaller than the above-described range, repetition durability is slightly decreased. In a case where the composition ratio of gallium (Ga) as the third element is larger than the above-described range, a leakage current value is slightly increased. In a case where the composition ratio of gallium (Ga) as the third element is smaller than the above-described range, an effect of gallium (Ga) becomes smaller, chemical stability is decreased, and process durability is slightly decreased. In a case where the composition ratio of germanium (Ge) is out of the above-described range, stability of the amorphous structure is decreased, and a drift index is slightly deteriorated. In a case where the additive amount of nitrogen (N) is smaller than the above-described range, durability of the repetitive operation is slightly decreased.

(2-2. Workings and Effects)

Causes of threshold voltage variation of the switch device include, in addition to the above-described deterioration in characteristics caused by the repetitive operation, fluctuations in the threshold voltage caused by temporal change (drift). For example, the drift is a phenomenon in which the threshold voltage in a subsequent switch operation is varied from occurrence of the last switch operation as time (interval time) goes on. In the memory cell array, interval times of the respective switch devices are generally different; therefore, in a case where an influence of the drift is large, variation in the operation threshold voltage among the switch devices occurs to cause an operation error. Accordingly, in order to achieve an increase in capacity of the cross point memory cell array, reduction in change in the threshold voltage by the interval time of the switch device is demanded.

In contrast, in the present embodiment, the switch layer 22 includes one or more kinds of chalcogen elements selected from tellurium (Te), selenium (Se), and sulfur (S), one or more kinds of first elements selected from phosphorus (P) and arsenic (As), and one or more kinds of third elements selected from aluminum (Al), gallium (Ga), and indium (In). This makes it possible to achieve a stable amorphous structure that is resistant to structure change and atomic variation even in a case where an electric field associated with the switch operation is applied to the switch layer 52. Accordingly, it is possible to reduce the drift.

As described above, in the switch device 50 according to the present embodiment, the switch layer 22 includes the chalcogen elements, one or more kinds selected from phosphorus (P) and arsenic (As), and one or more kinds selected from aluminum (Al), gallium (Ga), and indium (In). This leads to reduction in the drift and reduction in threshold voltage variation caused by the interval time of the switch device 50, which makes it possible to improve stability of the threshold voltage. Accordingly, it is possible to achieve an increase in capacity and an increase in life of the cross point memory cell array.

<3. Third Embodiment>
(3-1. Configuration of Switch Device)

FIG. 16 illustrates an example of a cross-sectional configuration of a switch device (a switch device 60) according to the third embodiment of the present disclosure. The switch device 60 selectively operates any of a plurality of storage devices (memory devices 30) arranged in the memory cell array 1 having a so-called cross point array structure illustrated in FIG. 5, for example, as with the switch device 20 (or 20A, 20B, 20C, or 20D) according to the foregoing first embodiment and the switch device 50 according to the second embodiment. The switch device 60 includes the lower electrode 21 (the first electrode), a switch layer 62, and the upper electrode 23 (the second electrode) in this order.

The lower electrode 21 and the upper electrode 23 each include any of the materials described in the foregoing first embodiment. Examples of the materials include tungsten (W), tungsten nitride (WN), titanium nitride (TiN), carbon (C), copper (Cu), aluminum (Al), molybdenum (Mo), tantalum (Ta), tantalum nitride (TaN), silicide, etc. It is to be noted that a single layer film or a multilayer film in a range from 1 nm to 30 nm including W, WN, TiN, TiW, TaN, carbon (C), etc. may be formed between the lower electrode 21 and the switch layer 62. This causes a favorable interface to be formed between the lower electrode 21 and the switch layer 62.

The switch layer 62 according to the present embodiment includes an element of Group 16 in the periodic table, specifically, one or more kinds of chalcogen elements selected from tellurium (Te), selenium (Se), and sulfur (S), as with the switch layer 22 according to the foregoing first embodiment. In the switch device 20 having the OTS phenomenon, it is necessary for the switch layer 52 to stably maintain an amorphous structure thereof even in a case where a voltage bias for switching is applied. It is possible to generate the OTS phenomenon stably as the amorphous structure becomes more stable. The switch layer 52 includes, in addition to the above-described chalcogen elements, one or more kinds of elements (first elements) selected from phosphorus (P) and arsenic (As), one or more kinds of elements (second elements) selected from boron (B) and carbon (C), and one or more kinds of third elements selected from aluminum (Al), gallium (Ga), and indium (In).

The switch layer 62 preferably includes the chalcogen elements, one or more kinds of first elements selected from phosphorus (P) and arsenic (As), one or more kinds of second elements selected from boron (B) and carbon (C), and one or more kinds of third elements selected from aluminum (Al), gallium (Ga), and indium (In) in the following ranges. The chalcogen elements are preferably included in a range from 20 at % to 70 at % both inclusive. The first elements are preferably included in a range from 3 at % to 40 at % both inclusive. The second elements are preferably included in a range from 3 at % to 50 at % both inclusive. The third elements are preferably included in a range from 3 at % to 40 at % both inclusive.

The switch layer 62 may further include, in addition to the above-described elements, one or both of nitrogen (N) and oxygen (O). Nitrogen (N) is bonded to aluminum (Al) and gallium (Ga) to form a compound having high resistance. It is to be noted that in a case where the switch layer 62 includes nitrogen (N) and oxygen (O), the switch layer 62 preferably includes the chalcogen elements, the first elements, the second elements, and the third elements in the above-described ranges with a total of composition ratios excluding nitrogen (N) and oxygen (O) being 100 at %.

Moreover, the switch layer 62 may include one or both of silicon (Si) and germanium (Ge). In a case where the switch layer 62 includes silicon (Si), germanium (Ge), or the like, nitrogen (N) is also bonded to these elements to form a compound having high resistance. In other words, configuring the switch layer 62 with use of the third elements such as aluminum (Al) and gallium (Ga), silicon (Si) or germanium (Ge), and nitrogen (N) makes it possible to form the switch layer 62 having a high resistance value. For example, a bandgap of a compound of nitrogen (N) and aluminum (Al) is around 6.2. This reduces generation of a leakage current, as compared with a case where nitrogen (N) is not included. In the switch layer 62 including the third elements such as aluminum (Al) and gallium (Ga), silicon (Si) or germanium (Ge), and nitrogen (N), a compound in which these elements are bonded to one another is diffused into a layer, thereby stabilizing the amorphous structure.

The switch layer 62 is preferably formed including any one of elemental compositions of BGaPTe, BGaAsTe, BGaPTeN, BGaAsTeN, BGaPTeO, BGaAsTeO, BGaCPTe, BGaCAsTe, BGaCPTeN, BGaCAsTeN, BGaCPTeO, BGaCAsTeO, BGaPSe, BGaAsSe, BGaPSeN, BGaAsSeN, BGaPSeO, BGaAsSeO, BGaCPSe, BGaCAsSe, BGaCPSeN, BGaCAsSeN, BGaCPSeO, and BGaCAsSeO, for example. Alternatively, the switch layer 62 is preferably formed including any one of elemental compositions of BAlGaPTe, BAlGaAsTe, BAlGaPTeN, BAlGaAsTeN, BAlGaPTeO, BAlGaAsTeO, BAlGaCPTe, BAlGaCAsTe, BAlGaCPTeN, BAlGaCAsTeN, BAlGaCPTeO, BAlGaCAsTeO, BAlGaPSe, BAlGaAsSe, BAlGaPSeN, BAlGaAsSeN, BAlGaPSeO, BAlGaAsSeO, BAlGaCPSe, BAlGaCAsSe, BAlGaCPSeN, BAlGaCAsSeN, BAlGaCPSeO, and BAlGaCAsSeO, for example. Moreover, the switch layer 62 is preferably formed including any one of elemental compositions of BGaInPTe, BGaInAsTe, BGaInPTeN, BGaInAsTeN, BGaInPTeO, BGaInAsTeO, BGaInCPTe, BGaInCAsTe, BGaInCPTeN, BGaInCAsTeN, BGaInCPTeO, BGaInCAsTeO, BGaInPSe, BGaInAsSe, BGaInPSeN, BGaInAsSeN, BGaInPSeO, BGaInAsSeO, BGaInCPSe, BGaInCAsSe, BGaInCPSeN, BGaInCAsSeN, BGaInCPSeO, and BGaInCAsSeO, for example.

In addition, the switch layer 62 may use the following composition. For example, in a case where the switch layer 62 includes phosphorus (P) as the first element and boron (B) and carbon (C) as the second elements, the switch layer 62 preferably includes the elemental composition of BGaPCTeN. Composition ratios of the respective elements in this elemental composition are preferably in the following ranges in a state in which nitrogen (N) is excluded. The composition ratio of the chalcogen element is preferably in a range from 45 at % to 55 at % both inclusive. The composition ratio of phosphorus (P) as the first element is preferably in a range from 5 at % to 15 at % both inclusive. A total of the composition ratios of boron (B) and carbon (C) as the second elements is preferably in a range from 20 at % to 30 at % both inclusive. The composition ratio of gallium (Ga) as the third element is preferably in a range from 8 at % to 18 at % both inclusive. Moreover, an additive amount of nitrogen (N) is preferably in a range from 5 at % to 15 at % both inclusive with respect to all the constituent elements.

In the above-described elemental composition, in a case where the composition ratio of phosphorus (P) as the first element is larger than the above-described range, stability of the amorphous structure is decreased, and heat resistance is slightly decreased. In a case where the total of the composition ratios of phosphorus (P) as the first element is smaller than the above-described range, repetition durability is slightly decreased. In a case where the total of the composition ratios of boron (B) and carbon (C) as the second elements is larger than the above-described range, threshold voltage variation tends to be increased. In a case where the composition ratio of boron (B) and carbon (C) is smaller than the above-described range, boron (B) and carbon (C) forming a strong bond are decreased to slightly decrease heat resistance. In a case where the composition ratio of gallium (Ga) as the third element is larger than the above-described range, repetition durability is slightly decreased. In a case where the composition ratio of gallium (Ga) as the third element is smaller than the above-described range, an effect of gallium (Ga) becomes smaller, chemical stability is decreased, process durability is slightly decreased, and, for example, damage caused by dry etching is increased. In a case where the additive amount of nitrogen (N) is larger than the above-described range, stability of the amorphous structure is decreased, and repetition durability is slightly decreased. In a case where the additive amount of nitrogen (N) is smaller than the above-described range, repetition durability is slightly decreased.

Moreover, the switch layer 62 may include the elemental composition of BGaInCPTeN. Gallium (Ga) and indium (In) have the same valence and also have similar properties, but have different atomic (ionic) radii. As described above, in a case where indium (In) is included as the third element in addition to gallium (Ga), adjusting respective contents makes it possible to stabilize the amorphous structure and improve characteristics such as repetitive operation. Composition ratios of the respective elements in this elemental composition are preferably in the following ranges in a state in which nitrogen (N) is excluded, for example. The composition ratio of the chalcogen element is preferably in a range from 55 at % to 65 at % both inclusive. The composition ratio of phosphorus (P) as the first element is preferably in a range from 8 at % to 18 at % both inclusive. A total of the composition ratios of boron (B) and carbon (C) as the second elements is preferably in a range from 10 at % to 20 at % both inclusive. The composition ratio of gallium (Ga) as the third element is preferably in a range from 5 at % to 20 at % both inclusive, and the composition ratio of indium (In) is preferably in a range from 5 at % to 20 at % both inclusive. Moreover, the additive amount of nitrogen (N) is preferably in a range from 5 at % to 15 at % both inclusive with respect to all the constituent elements.

In the above-described elemental composition, in a case where the composition ratio of phosphorus (P) as the first element is larger than the above-described range, stability of the amorphous structure is decreased, and heat resistance is slightly decreased. In a case where the composition ratio of phosphorus (P) as the first element is smaller than the above-described range, repetition durability is slightly decreased. In a case where the total of the composition ratios of boron (B) and carbon (C) as the second elements is smaller than the above-described range, boron (B) and carbon (C) that form a strong bond are decreased to slightly decrease heat resistance. In a case where the total of the composition ratios of boron (B) and carbon (C) as the second elements is larger than the above-described range, threshold voltage variation tends to be increased. In a case where the composition ratios of gallium (Ga) and indium (In) as the third elements are smaller than the above-described ranges, effects of gallium (Ga) and indium (In) are decreased, chemical stability is decreased, process durability is slightly decreased, and for example, damage caused by dry etching is increased. In a case where the composition ratios of gallium (Ga) and indium (In) as the third elements are larger than the above-described ranges, repetition durability is slightly decreased. In a case where the additive amount of nitrogen (N) is smaller than the above-described range, repetition durability is slightly decreased. In a case where the additive amount of nitrogen (N) is larger than the above-described range, stability of the amorphous structure is decreased, and repetition durability is slightly decreased.

Moreover, the switch layer 62 may include the elemental composition of BGaCGePTeN. Adding germanium (Ge) makes it possible to reduce threshold voltage variation. The composition ratios of the respective elements in this elemental composition are preferably in the following ranges in a state in which nitrogen (N) is excluded, for example. The composition ratio of the chalcogen element is preferably in a range from 50 at % to 60 at % both inclusive. The composition ratio of phosphorus (P) as the first element is preferably in a range from 3 at % to 10 at % both inclusive. A total of the composition ratios of Boron (B) and carbon (C) as the second elements is preferably in a range from 20 at % to 30 at % both inclusive. The composition ratio of gallium (Ga) as the third element is preferably in a range from 3 at % to 10 at % both inclusive. The composition ratio of germanium (Ge) is preferably in a range from 8 at % to 20 at % both inclusive. Moreover, the additive amount of nitrogen (N) is preferably in a range from 3 at % to 10 at % both inclusive with respect to all the constituent elements.

In the above-described elemental composition, in a case where the composition ratio of phosphorus (P) as the first element is larger than the above-described range, stability of the amorphous structure is decreased, and heat resistance is slightly decreased. In a case where the composition ratio of phosphorus (P) as the first element is smaller than the above-described range, repetition durability is slightly decreased. In a case where the total of the composition ratios of boron (B) and carbon (C) as the second elements is larger than the above-described range, threshold voltage variation tends to be increased. In a case where the total of the composition ratios of boron (B) and carbon (C) as the second elements is smaller than the above-described range, boron (B) and carbon (C) that form a strong bond are decreased to slightly decrease heat resistance. In a case where the composition ratio of gallium (Ga) as the third element is larger than the above-described range, repetition durability is slightly decreased. In a case where the composition ratio of gallium (Ga) as the third element is smaller than the above-described range, an effect of gallium (Ga) is decreased, chemical stability is decreased, process durability is slightly decreased, and for example, damage caused by dry etching is increased. Even in a case where the composition ratio of germanium (Ge) is larger than the above-described range, stability of the amorphous structure is decreased, and threshold voltage variation is slightly increased. In a case where the composition ratio of germanium (Ge) is smaller than the above-described range, stability of the amorphous structure is decreased, and threshold voltage variation is slightly increased. In a case where the additive amount of nitrogen is larger than the above-described range, stability of the amorphous structure is decreased, and repetition durability is slightly decreased. In a case where the additive amount of nitrogen (N) is smaller than the above-described range, repetition durability is slightly decreased.

Moreover, the switch layer 62 may use arsenic (As) in place of phosphorus (P) as the first element, and include the elemental composition of BGaCAsTeN. The composition ratios of the respective elements in this elemental composition are preferably in the following ranges in a state in which nitrogen (N) is excluded. The composition ratio of the chalcogen element is preferably in a range from 30 at % to 50 at % both inclusive. The composition ratio of arsenic (As) as the first element is preferably in a range from 12 at % to 22 at % both inclusive. A total of the composition ratios of boron (B) and carbon (C) as the second elements is preferably in a range from 15 at % to 35 at % both inclusive. The composition ratio of gallium (Ga) as the third element is preferably in a range from 15 at % to 25 at % both inclusive. Moreover, the additive amount of nitrogen (N) is preferably in a range from 3 at % to 15 at % both inclusive with respect to all the constituent elements.

In the above-described elemental composition, in a case where the composition ratio of arsenic (As) as the first element is larger than the above-described range, stability of the amorphous structure is decreased, and heat resistance is slightly decreased. In a case where the composition ratio of arsenic (As) as the first element is smaller than the above-described range, repetition durability is slightly decreased. In a case where the additive amount of nitrogen (N) is smaller than the above-described range, repetition durability is slightly decreased. In a case where the total of the composition ratios of boron (B) and carbon (C) as the second elements is larger than the above-described range, threshold voltage variation tends to be increased. In a case where the total of the composition ratios of boron (B) and carbon (C) as the second elements is smaller than the above-described range, boron (B) and carbon (C) that form a strong bond are decreased to slightly decrease heat resistance. In a case where the composition ratio of gallium (Ga) as the third element is larger than the above-described range, repetition durability is slightly decreased. In a case where the composition ratio of gallium (Ga) as the third element is smaller than the above-described range, an effect of gallium (Ga) is decreased, chemical stability is decreased, process durability is slightly decreased, and for example, damage caused by dry etching is increased. In a case where the additive amount of nitrogen is larger than the above-described range, stability of the amorphous structure is decreased, and repetition durability is slightly decreased.

Moreover, the switch layer 62 may include the elemental composition of BGaCSiAsTeN. Adding silicon (Si) makes it possible to reduce threshold voltage variation. The composition ratios of the respective elements in this elemental composition is preferably in the following ranges in a state in which nitrogen (N) is excluded, for example. The composition ratio of the chalcogen element is preferably in a range from 25 at % to 35 at % both inclusive. The composition ratio of arsenic (As) as the first element is preferably in a range from 12 at % to 22 at % both inclusive. A total of the composition ratios of boron (B) and carbon (C) as the second elements is preferably in a range from 17 at % to 27 at % both inclusive. The composition ratio of gallium (Ga) as the third element is preferably in a range from 16 at % to 26 at % both inclusive. The composition ratio of silicon (Si) is preferably in a range from 5 at % to 15 at % both inclusive. Moreover, the additive amount of nitrogen (N) is preferably in a range from 3 at % to 15 at % both inclusive with respect to all the constituent elements.

In the above-described elemental composition, in a case where the composition ratio of arsenic (As) as the first element is larger than the above-described range, stability of the amorphous structure is decreased, and heat resistance is slightly decreased. In a case where the composition ratio of arsenic (As) as the first element is smaller than the above-described range, repetition durability is slightly decreased. In a case where the total of the composition ratios of boron (B) and carbon (C) as the second elements is larger than the above-described range, threshold voltage variation tends to be increased. In a case where the total of the composition ratios of boron (B) and carbon (C) as the second elements is smaller than the above-described range, boron (B) and carbon (C) that form a strong bond are decreased to slightly decrease heat resistance. In a case where the composition ratio of gallium (Ga) as the third element is larger than the above-described range, repetition durability is slightly decreased. In a case where the composition ratio of gallium (Ga) as the third element is smaller than the above-described range, an effect of gallium (Ga) is decreased, chemical stability is decreased, process durability is slightly decreased, and for example, damage caused by dry etching is increased. Even in a case where the composition ratio of silicon (Si) is larger than the above-described range, stability of the amorphous structure is decreased, and threshold voltage variation is slightly increased. In a case where the composition ratio of silicon (Si) is smaller than the above-described range, stability of the amorphous structure is decreased, and threshold voltage variation is slightly increased. In a case where the additive amount of nitrogen is larger than the above-described range, stability of the amorphous structure is decreased, and repetition durability is slightly decreased. In a case where the additive amount of nitrogen is smaller than the above-described range, repetition durability is slightly decreased.

Moreover, the switch layer 62 may include the elemental composition of BGaCGeAsTeN. Adding germanium (Ge) makes it possible to reduce threshold voltage variation. The composition ratios of the respective elements in this elemental composition are preferably in the following ranges in a state in which nitrogen (N) is excluded, for example. The composition ratio of the chalcogen element is preferably in a range from 25 at % to 35 at % both inclusive. The composition ratio of arsenic (As) as the first element is preferably in a range from 15 at % to 25 at % both inclusive. A total of the composition ratios of Boron (B) and carbon (C) as the second elements is preferably in a range from 10 at % to 20 at % both inclusive. The composition ratio of gallium (Ga) as the third element is preferably in a range from 20 at % to 30 at % both inclusive. The composition ratio of germanium (Ge) is preferably in a range from 8 at % to 20 at % both inclusive. Moreover, the additive amount of nitrogen (N) is preferably in a range from 3 at % to 15 at % both inclusive with respect to all the constituent elements.

In the above-described elemental composition, in a case where the composition ratio of arsenic (As) as the first element is larger than the above-described range, stability of the amorphous structure is decreased, and heat resistance is slightly decreased. In a case where the composition ratio of arsenic (As) as the first element is smaller than the above-described range, repetition durability is slightly decreased. In a case where the total of the composition ratios of boron (B) and carbon (C) as the second elements is larger than the above-described range, threshold voltage variation tends to be increased. In a case where the total of the composition ratios of boron (B) and carbon (C) as the second elements is smaller than the above-described range, boron (B) and carbon (C) that form a strong bond are decreased to slightly decrease heat resistance. In a case where the composition ratio of gallium (Ga) as the third element is larger than the above-described range, repetition durability is slightly decreased. In a case where the composition ratio of gallium (Ga) as the third element is smaller than the above-described range, an effect of gallium (Ga) is decreased, chemical stability is decreased, process durability is slightly decreased, and for example, damage caused by dry etching is increased. Even in a case where the composition ratio of germanium (Ge) is larger than the above-described range, stability of the amorphous structure is decreased, and threshold voltage variation is slightly increased. In a case where the composition ratio of germanium (Ge) is smaller than the above-described range, stability of the amorphous structure is decreased, and threshold voltage variation is slightly increased. In a case where the additive amount of nitrogen is larger than the above-described range, stability of the amorphous structure is decreased, and repetition durability is slightly decreased. In a case where the additive amount of nitrogen is smaller than the above-described range, repetition durability is slightly decreased.

Moreover, the switch layer 62 may use, as the chalcogen element, selenium (Se) in the same group in place of tellurium (Te). In a case where selenium (Se) is used, the switch layer 62 has a larger bandgap as compared with a case where tellurium (Te) is used; therefore, using selenium (Se) makes it possible for the switch layer to have higher resistance, and makes it possible to decrease the leakage current value. It is to be noted that selenium (Se) and tellurium (Te) are in the same group, and the composition ratios of the respective elements in the elemental composition is similar to those in the case of using tellurium (Te). That is, it is preferable that in a state in which nitrogen (N) is excluded, selenium (Se) be included in a range from 20 at % to 70 at % both inclusive; arsenic (As) as the first element be included in a range from 3 at % to 40 at % both inclusive; boron (B) and carbon (C) as the second elements be included in a range from 3 at % to 50 at % both inclusive; and gallium (Ga) as the third element be included in a range of 40 at % or less. Moreover, the additive amount of nitrogen (N) is preferably in a range from 0 at % to 30 at % both inclusive with respect to all the constituent elements.

The switch layer 62 using selenium (Se) preferably includes, for example, the elemental composition of BGaCAsSeN. The composition ratios of the respective elements in this elemental composition is preferably in the following ranges in a state in which nitrogen (N) is excluded. The composition ratio of selenium (Se) as the chalcogen element is preferably in a range from 40 at % to 60 at % both inclusive. The composition ratio of arsenic (As) as the first element is preferably in a range from 30 at % to 40 at % both inclusive. The composition ratio of gallium (Ga) as the third element is preferably in a range from 3 at % to 10 at % both inclusive. Moreover, the composition ratios of boron (B) and carbon (C) are preferably in a range from 3 at % to 15 at % both inclusive. The additive amount of nitrogen (N) is preferably in a range from 5 at % to 20 at % both inclusive with respect to all the constituent elements.

In the above-described elemental composition, in a case where the composition ratio of arsenic (As) as the first element is larger than the above-described range, stability of the amorphous structure is decreased, and heat resistance is slightly decreased. In a case where the composition ratio of arsenic (As) as the first element is smaller than the above-described range, repetition durability is slightly decreased. In a case where the composition ratio of gallium (Ga) as the third element is larger than the above-described range, the leakage current value is slightly increased. In a case where the composition ratio of gallium (Ga) as the third element is smaller than the above-described range, an effect of gallium (Ga) is decreased, chemical stability is decreased, and process durability is slightly decreased. In a case where the composition ratios of boron (B) and carbon (C) as the second elements are larger than the above-described range, threshold voltage variation in the repetitive operation is slightly increased. In a case where the composition ratios of boron (B) and carbon (C) as the second elements are smaller than the above-described range, heat resistance is slightly decreased. In a case where the additive amount of nitrogen (N) is larger than the above-described amount, stability of the amorphous structure is decreased, and the drift is slightly deteriorated. In a case where the additive amount of nitrogen (N) is smaller than the above-described range, durability of the repetitive operation is slightly decreased. Moreover, the switch layer 62 may include a composition including silicon (Si) such as BGaCSiAsSeN. In this case, silicon (Si) is preferably included in a range from 3 at % to 20 at % both inclusive.

It is to be noted that the switch layer 62 may include any element other than these elements without impairing the effects of the present disclosure.

For example, in a case where phosphorus (P) is included as the first element, for example, adding zinc (Zn) such as ZnBCGaPTeN makes it possible to further reduce threshold voltage variation. The composition ratios of the respective elements in this elemental composition are preferably in the following ranges in a state in which nitrogen (N) is excluded, for example. The composition ratio of the chalcogen element is preferably in a range from 55 at % to 65 at % both inclusive. The composition ratio of phosphorus (P) as the first element is preferably in a range from 5 at % to 15 at % both inclusive. A total of the composition ratios of boron (B) and carbon (C) as the second elements is preferably in a range from 10 at % to 20 at % both inclusive. The composition ratio of gallium (Ga) as the third element is preferably in a range from 5 at % to 15 at % both inclusive. The composition ratio of Zinc (Zn) is preferably in a range from 5 at % to 15 at % both inclusive. Moreover, the additive amount of nitrogen (N) is preferably in a range from 3 at % to 15 at % both inclusive with respect to all the constituent elements.

In the above-described elemental composition, in a case where the composition ratio of phosphorus (P) as the first element is larger than the above-described range, stability of the amorphous structure is decreased, and heat resistance is slightly decreased. In a case where the composition ratio of phosphorus (P) as the first element is smaller than the above-described range, repetition durability is slightly decreased. In a case where the total of the composition ratios of boron (B) and carbon (C) as the second elements is larger than the above-described range, threshold voltage variation tends to be increased. In a case where the total of the composition ratios of boron (B) and carbon (C) as the second elements is smaller than the above-described range, boron (B) and carbon (C) that form a strong bond are decreased to slightly decrease heat resistance. In a case where the composition ratio of gallium (Ga) as the third element is larger than the above-described range, repetition durability is slightly decreased. In a case where the composition ratio of gallium (Ga) as the third element is smaller than the above-described range, an effect of gallium (Ga) is decreased, chemical stability is decreased, process durability is slightly decreased, and for example, damage caused by dry etching is increased. Even in a case where the composition ratio of zinc (Zn) is larger than the above-described range, stability of the amorphous structure is decreased, and threshold voltage variation is slightly increased. In a case where the composition ratio of zinc (Zn) is smaller than the above-described range, stability of the amorphous structure is decreased, and threshold voltage variation is slightly increased. In a case where the additive amount of nitrogen is larger than the above-described range, stability of the amorphous structure is decreased, and repetition durability is slightly decreased. In a case where the additive amount of nitrogen is smaller than the above-described range, repetition durability is slightly decreased.

(3-2. Workings and Effects)

As described above, threshold voltage variation of the switch device encompasses two variations, i.e., variation caused by deterioration in characteristics by the repetitive operation and variation by fluctuations in the threshold voltage caused by temporal change (drift). In order to achieve an increase in capacity of the cross point memory cell array, it is desirable to reduce both threshold voltage variation caused by repetitive operation and threshold voltage variation caused by temporal change.

In contrast, in the present embodiment, the switch layer 22 includes one or more kinds of chalcogen elements selected from tellurium (Te), selenium (Se), and sulfur (S), one or more kinds of first elements selected from phosphorus (P) and arsenic (As), one or more kinds of second elements selected from boron (B) and carbon (C), and one or more kinds of third element selected from aluminum (Al), gallium (Ga), and indium (In). This makes it possible to stabilize the amorphous structure of the switch layer 62 and reduce threshold voltage variation caused by the repetitive operation and threshold voltage variation caused by temporal change. In other words, this makes it possible to improve stability of the threshold voltage with respect to the repetitive operation and temporal change.

As described above, in the switch device 60 according to the present embodiment, the switch layer 62 is formed with use of the chalcogen elements, one or more kinds selected from phosphorus (P) and arsenic (As), one or more kinds selected from boron (B) and carbon (C), and one or more kinds selected from aluminum (Al), gallium (Ga), and indium (In). This makes it possible to reduce both threshold voltage variation caused by the repetitive operation and threshold voltage variation caused by temporal change and further improve stability of the threshold voltage. Accordingly, it is possible to achieve an increase in capacity and an increase in life of the cross point memory cell array.

It is to be noted that in the foregoing second embodiment and the foregoing third embodiment, the configurations of the switch device 50 and the switch device 60 are respectively illustrated in FIG. 14 and FIG. 15 as examples, but are not limited thereto. For example, the switch device 50 and the switch device 60 may have any of the stacking structures of the switch devices 20B, 20C, and 20D illustrated in FIGS. 2 to 4 as examples other than the switch device 20A according to the foregoing first embodiment.

<4. Modification Examples>

(4-1. Modification Example 1)

FIG. 17 illustrates an example of a configuration of a memory cell array 2 according to a modification example of the present disclosure. The memory cell array 2 has a so-called cross point array structure, as with the above-described memory cell array 1. In the present modification example, the memory device 30 includes the memory layer 31 extending along each of the bit lines BL that extend in directions common to one another. The switch device 20 includes the switch layer 22 extending along the word line WL that extends in a direction different from the extending direction of the word lines WL (for example, in a direction orthogonal to the extending direction of the bit lines BL). The switch layer 22 and the memory layer 31 are stacked with the intermediate electrode 41 interposed therebetween at cross points of the plurality of word lines WL and the plurality of bit lines BL.

As described above, the switch device 20 and the memory device 30 are not only provided at the cross points, but also respectively extend along the extending direction of the word lines WL and the extending direction of the bit lines BL, which makes it possible to form a switch device layer or a memory device layer simultaneously with a layer that is to serve as the bit lines BL or the word lines WL and collectively perform shape processing by a photolithography process. Accordingly, it is possible to reduce process steps.

It is to be noted that it is possible to replace the switch device 20 of the memory cell array 2 illustrated in FIG. 17 with any of the switch devices 50 and 60 according to the foregoing second embodiment and the foregoing third embodiment.

(4-2. Modification Example 2)

FIGS. 18 to 21 respectively illustrate examples of configurations of memory cell arrays 3 to 6 having a three-dimensional configuration according to a modification example of the present disclosure in perspective view. In the memory cell array having a three-dimensional configuration, the respective word lines WL extend in directions common to one another. The respective bit lines BL extend in directions that are different from the extending direction of the word lines WL (for example, in directions orthogonal to the extending direction of the word lines WL) and common to one another. Moreover, the plurality of word lines WL and the plurality of bit lines BL are disposed in a plurality of respective layers.

In a case where the plurality of word lines WL are disposed separately in a plurality of levels, the plurality of bit lines BL are disposed in a layer between a first layer in which a plurality of word lines WL are disposed and a second layer in which a plurality of word lines WL are disposed. The second layer is adjacent to the first layer. In a case where the plurality of bit lines BL are disposed separately in a plurality of levels, the plurality of word lines WL are disposed in a layer between a third layer in which a plurality of bit lines BL are disposed and a fourth layer in which a plurality of bit lines BL are disposed. The fourth layer is adjacent to the third layer. In a case where the plurality of word lines WL are disposed separately in a plurality of levels and the plurality of bit lines BL are disposed separately in a plurality of levels, the plurality of word lines WL and the plurality of bit lines BL are alternately disposed in a stacking direction of the memory cell array.

The memory cell array according to the present modification example has a vertical cross point configuration in which either the word lines WL or the bit lines BL are provided in parallel to a Z-axis direction and the other remaining lines are provided in parallel to an XY-plane direction. For example, as illustrated in FIG. 18, the memory cell array may have a configuration in which the plurality of word lines WL and the plurality of bit lines BL respectively extend in an X-axis direction and the Z-axis direction and the memory cells 10 are disposed at respective cross points of the word lines WL and the bit lines BL. Moreover, as illustrated in FIG. 19, the memory cell array may have a configuration in which the memory cells 10 are disposed on both sides of each of cross points of the plurality of word lines WL and the plurality of bit lines BL respectively extending in the X-axis direction and the Z-axis direction. Further, as illustrated in FIG. 20, the memory cell array may have a configuration including the plurality of bit lines BL extending in the Z-axis direction, and a plurality of word lines of two kinds extending in two directions, i.e., the X-axis direction or a Y-axis direction. Furthermore, the plurality of word lines WL and the plurality of bit lines BL do not necessarily extend in one direction. For example, as illustrated in FIG. 21, for example, the plurality of bit lines BL may extend in the Z-axis direction, and the plurality of word lines WL may extend in the X-axis direction, be bent in the Y-axis direction in the middle, and be bent again in the X-axis direction, that is, may extend in a so-called U-letter like shape in the XY plane.

As described above, the memory cell array of the present disclosure has a three-dimensional configuration in which the plurality of memory cells 10 are disposed in a plane (two-dimensionally, in an XY-plane direction) and further stacked in the Z-axis direction, which makes it possible to provide a storage apparatus having higher density and a large capacity.

<5. Application Example>

FIG. 22 illustrates a configuration of a data storage system (a data storage system 500) including a non-volatile memory system (a memory system 400) that includes the memory cell array 1 (or any of the memory cell arrays 2 to 5) including the memory cells 10 described in the foregoing embodiments. The data storage system 500 includes a host computer 100, a memory controller 200, and a memory 300. The memory system 400 includes the memory controller 200 and the memory 300.

The host computer 100 issues, to the memory 300, a command for read processing and write processing of data, processing related to error correction, etc. The host computer 100 includes a processor 110 and a controller interface 101. The processor 110 executes processing as the host computer 100, and the controller interface 101 is used for exchange with the memory controller 200.

The memory controller 200 performs control of a request to the memory 300 in accordance with a command from the host computer 100. The memory controller 200 includes a control unit 210, an ECC processing unit 220, a data buffer 230, a host interface 201, and a memory interface 202.

The control unit 210 controls the entire memory controller 200. The control unit 210 interprets the command issued by the host computer 100, and makes a necessary request to the memory 300.

The ECC processing unit 220 executes generation of an error correcting code (ECC) of data stored in the memory 300 and error detection and correction of data read from the memory 300.

The data buffer 230 is a buffer used to temporarily hold write data received from the host computer 100, read data received from the memory 300, etc. in transfer of these data.

The host interface 201 is an interface used for exchange with the host computer 100. The memory interface 202 is an interface used for exchange with the memory 300.

The memory 300 includes a control unit 310, a memory cell array 320, and a controller interface 301. The control unit 310 controls the entire memory 300, and controls access to the memory cell array 320 in accordance with a request received from the memory controller 200. The controller interface 301 is an interface used for exchange with the memory controller 200.

The memory cell array 320 uses the memory cell array 1 (or any of the memory cell arrays 2 to 5) having a cross point array structure including the plurality of word lines WL, the plurality of bit lines BL, and the plurality of memory cells 10 that are disposed at respective cross points one by one. The memory cell 10 includes the switch device 20 (or any of the switch devices 20A, 20B, 20C, and 20D) described in the foregoing embodiments, and a memory device. The memory device is a resistance change memory (the memory device 30) having a stacking structure of the resistance change layer and the ion source layer, as described above. The ion source layer includes movable elements that form a conduction path in the resistance change layer in response to application of an electric field. In addition, for example, an OTP (One Time Programmable) memory that uses a fuse and an anti-fuse and is writable only once, a unipolar phase change memory PCRAM, or a non-volatile memory (NVM) such as a magnetic memory using a magnetoresistive change device may be used.

Each of the memory cells 10 included in the memory cell array 320 includes a data region 321 and an ECC region 322. The data region 321 is a region for storage of normal data.

As described above, the memory system uses the cross point memory cell array 1 (or any of the memory cell arrays 2 to 5) including the switch device 20 of the present disclosure, which makes it possible to improve performance such as operation speed.

<6. Examples>

Specific examples of the present disclosure are described below.

(Experiment 1)

First, a lower electrode including TiN was cleaned by reverse sputtering. Next, a switch layer including BCTeN was formed with a film thickness in a range from 20 nm to 50 nm on TiN by reactive sputtering while feeding nitrogen into a film formation chamber, and thereafter a film of W was formed with a film thickness of 30 nm to form an upper electrode. Thereafter, patterning, and heat treatment for two hours at 320° C. were performed to fabricate one transistor-one switch device (an experimental example 1-1). Table 1 illustrates constituent elements of the switch layer and a difference between tenth threshold voltage and 1E6-th threshold voltage ($\Delta Vth_{10th\text{-}1E6}$ (represented as $\Delta Vth$ in Table 1)) in the experimental example 1-1. Next, repetitive operation was performed 1E6 times, and a threshold voltage after a predetermined cycles was measured. Measurement conditions included a limited current of 100 μAm, a pulse width of 1 μs, and a pulse stress of an application voltage of 6 V. FIG. 23 is a summary of results of such measurement.

TABLE 1

| Experimental Example | Switch Layer | $\Delta Vth$ |
| --- | --- | --- |
| 1-1 | BCTeN | 0.6 |

The switch device desirably constantly operates at a constant threshold voltage even if the switch device performs repetitive operation again and again, and reduction in threshold voltage variation by a method of driving the switch device and constituent materials of the switch device is demanded. In the experimental example 1-1, the threshold voltage (Vth) was kept substantially constant at 3.6 V immediately after 1E3 times, but was decreased thereafter. Herein, the difference between the tenth threshold voltage and the 1E6-th threshold voltage is defined as $\Delta Vth_{10th\text{-}1E6}$ (Expression 1). A value of $\Delta Vth_{10th\text{-}1E6}$ in the experimental example 1-1 was 0.6 V, and it was found that the threshold voltage was decreased with an increase in the number of times of repetitive operation.

(Math. 1)

$$\Delta Vth_{10th\text{-}1E6} = Vth \text{ (after 1E6 cycle)} - Vth \text{ (after 10 cycle)} \quad (1)$$

Next, in the experimental example 1-1, threshold voltage variation in a case where the repetitive operation was performed 300 times was measured. FIG. 24 is a summary of results of such measurement. An average of the threshold voltages after the repetitive operation in the experimental example 1-1 in 300 times of the repetitive operation was about 3.6 V, and a difference between a maximum value and a minimum value thereof was about 0.7 V.

(Experiment 2)

Next, eight kinds of switch devices were fabricated with use of a method similar to that in the experiment 1 except that the switch layer was formed with use of the elements described in the foregoing embodiments (experimental examples 2-1 to 2-8). Thereafter, a difference between tenth threshold voltage and 1E6-th threshold voltage ($\Delta Th_{10th-1E6}$) was calculated similarly to the experimental example 1-1, summarized in Table 2 together with the composition of each of the switch layers.

TABLE 2

| Experimental Example | Switch Layer | ΔVth |
|---|---|---|
| 2-1 | BCGaPTeN | 0.2 |
| 2-2 | BCGaPTe | 0.1 |
| 2-3 | BCGaPTeO | 0.2 |
| 2-4 | BCGaAsTeN | 0.1 |
| 2-5 | CGaPTeN | 0.2 |
| 2-6 | CGaAsTeN | 0.2 |
| 2-7 | BCAsTeN | 0.1 |
| 2-8 | BCAsTe | 0.1 |

As can be seen from Table 2, in the experimental examples 2-1 to 2-8, a variation width $\Delta Th_{10th-1E6}$ between the threshold voltages (Vth) after tenth repetitive operation and 1E6-th repetitive operation was decreased to 0.2 V or less, as compared with 0.6 V in the experimental example 1-1. The compositions of the switch layers in the experimental example 1-1 and the experimental example 2-1 differ in presence or absence of gallium (Ga) and phosphorus (P). The compositions of the switch layers in the experimental example 1-1 and the experimental example 2-7 differ in presence or absence of arsenic (As). Moreover, as can be seen from a comparison between the experimental example 2-1 and the experimental example 2-2 and a comparison between the experimental example 2-7 and the experimental example 2-8, nitrogen (N) may not necessarily be included. As can be seen from the experimental example 2-3, oxygen (O) may be included in place of nitrogen (N). Moreover, as can be seen from the experimental example 2-4, arsenic (As) may be used in place of phosphorus (P). Further, as can be seen from the experimental example 2-5 and the experimental example 2-6, boron may not necessarily be included as long as carbon (C) is included. Accordingly, it was found that the switch layer including boron (B) or carbon (C), phosphorus (P) or arsenic (As), and tellurium (Te) makes it possible to reduce the variation width $\Delta Th_{10th-1E6}$ between the threshold voltages by the repetitive operation. Moreover, it was found that the switch layer including boron (B) or carbon (C), phosphorus (P) or arsenic (As), gallium (Ga), and tellurium (Te) makes it possible to reduce the variation width $\Delta Th_{10th-1E6}$.

Next, in the experimental example 2-1, threshold voltage variation in a case where the repetitive operation was performed 300 times was measured with use of a method similar to that in the experiment 1. FIG. 25 is a summary of results of such measurement. The threshold voltage after the repetitive operation in the experimental example 2-1 was substantially constant at about 3.0 V up to 300 times. Moreover, a difference between a maximum value and a minimum value thereof was about 0.15 V. Herein, a ratio of magnitude of variation with respect to magnitude of the threshold voltage was calculated through dividing the difference between the maximum value and the minimum value of the threshold voltage by an average value of the threshold voltages, and the ratio was defined as a threshold voltage variation index in the repetitive operation (a variation index).

While the variation index in the experimental example 1-1 was 0.24, the variation index in the experimental example 2-1 was 0.05, and smaller by 0.19 than that in the experimental example 1-1. Likewise, the variation index in the experimental example 2-7 was 0.06, and smaller by 0.18 than that in the experimental example 1-1. Accordingly, it was found that in the switch devices in the experimental example 2-1 and the experimental example 2-7, threshold voltage variation in the repetitive operation was largely reduced. In other words, it was found that it was possible to widen the read margin RM. It is considered that this result is caused by simultaneous presence of boron (B) or carbon (C) and phosphorus (P) or arsenic (As) in the switch layer. Alternatively, it is considered that this result is caused by simultaneous presence of boron (B) or carbon (C), phosphorus (P) or arsenic (As), and gallium (Ga) in the switch layer. The reason for this is described below.

Boron (B) and carbon (C) each have a small atomic radius as compared with phosphorus (P), arsenic (As), tellurium (Te), etc. as described above. In the switch layer simultaneously including B and C, and P, As, Te, etc., a difference between the atomic radii of B and C and atomic radii of other elements is large, and the crystal structure is not easily formed accordingly. Accordingly, it is presumed that the amorphous structure is stabilized, as compared with the switch layer including As or P, and Te, etc. without including B and C. Moreover, B and C have a strong covalent property, and the chalcogen elements in amorphous are thereby stabilized. Accordingly, it is presumed that using one or both of B and C stabilizes the amorphous structure of the switch layer.

Arsenic (As) or phosphorus (P) in the same group forms, for example, chalcogenide glass with chalcogen elements such as tellurium (Te) and selenium (Se). Moreover, arsenic (As) or phosphorus (P) in the same group forms a compound, such as $As_2Te_3$ and $As_2Se_3$, having a higher melting point than that of the chalcogen elements. Accordingly, it is presumed that an interatomic bond of arsenic (As) and phosphorus (P), and tellurium (Te) and selenium (Se) is strong. Hence, it is presumed that using one or both of As and P stabilizes the chalcogen element in the switch layer and stabilizes the amorphous structure of the switch layer.

Gallium (Ga) forms, for example, a stable compound such as GaP and GaAs with phosphorus (P) or arsenic (As). Moreover, gallium (Ga) forms, for example, a compound such as GaTe and $Ga_2Te_3$ also with the chalcogen elements. Further, for example, arsenic (As) is easily bonded to the chalcogen elements, as described above. Accordingly, it is presumable that gallium (Ga), phosphorus (P) or arsenic (As), and the chalcogen elements are easily bonded to one another to form an amorphous structure. It is to be noted that aluminum (Al) and indium (In) belonging to the same Group 13 as gallium (Ga) and having similar properties also form, for example, a compound such as AlAs and InP with phosphorus (P) and arsenic (As). Moreover, aluminum (Al) and indium (In) form, for example, a compound such as InTe with the chalcogen elements. This makes it possible to easily presume that similar effects are achievable even with use of aluminum (Al) or indium (In) without limiting to gallium (Ga). Moreover, it is presumed that similar effects are achievable even in a case where two or more kinds of elements of Group 13 in the periodic table selected from aluminum (Al), gallium (Ga), and indium (In) are used.

It is to be noted that switch characteristics of the switch device of the present disclosure is based on publicly known OTS characteristics by the chalcogen elements; therefore, it is easily presumed that similar effects are achievable even in a case where one kind or a plurality of kinds of chalcogen elements (selenium (Se) and sulfur (S)) other than Te are used.

As described above, it is presumed that in a case where one or more kinds of chalcogen elements selected from tellurium (Te), selenium (Se) and sulfur (S), one or more kinds of elements selected from phosphorus (P) and arsenic (As), and one or more kinds of elements selected from boron (B) carbon (C) are selected and an amorphous structure in which these selected elements are uniformly mixed is formed, the respective elements become stable, thereby obtaining a stable amorphous structure having an increased melting point and an increased crystallization temperature. Moreover, it is presumed that even in a case where one or more kinds of elements selected from aluminum (Al), gallium (Ga), and indium (In) are added and an amorphous structure in which these elements are uniformly mixed is formed, the respective elements become stable, thereby obtaining a stable amorphous structure having an increased melting point and an increased crystallization temperature. In the stable amorphous structure, diffusion of constituent elements to another layer and structure alternation caused by an electric field and heat in a case where switch operation is repeatedly performed are less likely to occur. As a result, it is presumed that the threshold voltage with respect to repetitive operation is stabilized.

Moreover, it was found from this experiment that nitrogen (N) or oxygen (O) may be added to the switch layer. It is considered that bonding nitrogen (N) and oxygen (O) to the constituent elements contributes to stabilization of the amorphous structure. Accordingly, it is presumed that switch device characteristics such as reduction in leakage current are improved simultaneously with repetition characteristics.

(Experiment 3)

Next, composition ratios of elements included in the switch layer were examined. First, 24 kinds of switch devices including switch layers having different constituent elements or different composition ratios were fabricated with use of a method similar to that in the experiments 1 and 2 (experimental examples 3-1 to 3-24). Thereafter, switch device characteristics of each of the switch devices were measured, and a difference between tenth threshold voltage and 1E6-th threshold voltage ($\Delta Th_{10th-1E6}$) and threshold voltage variation index in the repetitive operation were calculated similarly to the experimental example 2-1, etc. Moreover, composition ratios in the respective experimental examples 3-1 to 3-24 were analyzed by RBS/NRA composition analysis. Herein, assuming that among the constituent elements, a total of content ratios (atomic weight ratios) of one or more kinds of chalcogen elements selected from tellurium (Te), selenium (Se), and sulfur (S), one or more kinds of elements (first elements) selected from phosphorus (P) and arsenic (As), one or more kinds of chalcogen elements selected from boron (B) and carbon (C), one or more kinds of elements (second elements) selected from boron (B) and carbon (C), one or more kinds of elements (third elements) selected from aluminum (Al), gallium (Ga), and indium (In), and other elements is 100, a composition ratio of each of the elements (the chalcogen elements, the first elements, the second elements, the third elements, and the other elements) was calculated. It is to be noted that a numerical value calculated herein is a value in a state in which nitrogen (N) and oxygen (O) are excluded. Table 3 is a summary of the composition of each of the switch layers, composition ratios of the constituent elements in the state in which nitrogen (N) and oxygen (O) are excluded, a difference between 0th threshold voltage and 1E6-th threshold voltage ($\Delta Th_{10th-1E6}$), and the threshold voltage variation index in each of the experimental examples 3-1 to 3-24.

TABLE 3

| Experimental Example | Elemental Composition of Switch Layer | Composition Ratio | | | | | ΔTh10th-1E6 | Variation Index |
| --- | --- | --- | --- | --- | --- | --- | --- | --- |
| | | Chalcogen Element | First Element | Second Element | Third Element | Other Element | | |
| 3-1 | BCAsSeN | 42 | 28 | 30 | 0 | 0 | 0.4 | 0.19 |
| 3-2 | BCGaAsTeN | 58 | 1 | 16 | 25 | 0 | 0.8 | 0.3 |
| 3-3 | BCAlGaPTeN | 13 | 31 | 16 | 40 | 0 | Not Operated | |
| 3-4 | BCGaAsTeN | 60 | 3 | 19 | 18 | 0 | 0.2 | 0.17 |
| 3-5 | BCAlPTeN | 20 | 30 | 20 | 30 | 0 | 0.3 | 0.11 |
| 3-6 | BCAlAsTeN | 35 | 10 | 15 | 40 | 0 | 0.2 | 0.13 |
| 3-7 | BCAlGaPTeN | 25 | 40 | 18 | 17 | 0 | 0.2 | 0.09 |
| 3-8 | BCAlGaAsTeN | 70 | 5 | 15 | 10 | 0 | 0.2 | 0.08 |
| 3-9 | BCAlGaAsTeN | 27 | 12 | 16 | 45 | 0 | 0.2 | 0.17 |
| 3-10 | CGaPTeN | 24 | 47 | 15 | 14 | 0 | Not Operated | |
| 3-11 | CGaAsTeN | 74 | 5 | 11 | 10 | 0 | Not Operated | |
| 3-12 | CAlGaPTeN | 50 | 29 | 1 | 20 | 0 | Film Peeling Confirmed | |
| 3-13 | CGaPTeN | 53 | 29 | 3 | 15 | 0 | 1 | 0.36 |
| 3-14 | CGaAsTeN | 21 | 13 | 50 | 16 | 0 | 0.4 | 0.13 |
| 3-15 | BCGaPTeN | 22 | 7 | 60 | 11 | 0 | 0.3 | 0.17 |
| 3-16 | BCGaPTeN | 52 | 10 | 25 | 13 | 0 | Not Operated | |
| 3-17 | BCGaInPTeN | 60 | 12 | 14 | 24 | 0 | 0.3 | 0.15 |
| 3-18 | BCGaGePTeN | 54 | 4 | 24 | 4 | 14 | 0.2 | 0.09 |
| 3-19 | BCGaAsTeN | 45 | 17 | 18 | 20 | 0 | 0.3 | 0.09 |
| 3-20 | BCGaSiAsTeN | 31 | 17 | 22 | 21 | 9 | 0.2 | 0.11 |
| 3-21 | BCGaGeAsTeN | 32 | 20 | 13 | 24 | 11 | 0.2 | 0.08 |
| 3-22 | ZnBCGaPTeN | 58 | 9 | 15 | 7 | 11 | 0.2 | 0.09 |
| 3-23 | BGaCAsSeN | 47 | 28 | 20 | 5 | 0 | 0.1 | 0.06 |
| 3-24 | BCGaSiAsSeN | 35 | 20 | 35 | 5 | 5 | 0.1 | 0.05 |

First, attention is paid on the content of the chalcogen element (herein, Te). In the experimental example 3-3 in which the content of the chalcogen element was 13 at %, the switch device did not operate. The chalcogen element is the most important element to obtain characteristics as the switch device. Accordingly, it is presumed that in the experimental example 3-3, the content of the chalcogen element was relatively low; therefore, the switch characteristics were not obtained. In contrast, in the experimental example 3-11 in which the content of the chalcogen element was 74 at %, film peeing occurred during a process. The reason for this is that the content of the chalcogen element was too high, thereby causing deterioration in film quality. Thus, it was found that the chalcogen element is preferably included in a range from 20 at % to 70 at % both inclusive.

Next, attention is paid on the content of the first element selected from phosphorus (P) and arsenic (As). In the experimental example 3-2 in which the content of the first element was 1 at %, $\Delta Vth_{10th-1E6}$ was 0.8 that was large. Moreover, as compared with other experimental examples, the variation index was 0.30 that was large. In the experimental example 3-10 in which the content of the first element was 47 at %, the switch device did not operate. It is considered that the reason for this is that the content of the first element was too high. Thus, it was found that the first element is preferably included in a range from 3 at % to 40 at % both inclusive.

Next, attention is paid on the content of the second element selected from boron (B) and carbon (C). In the experimental example 3-12 in which the content of the second element was 1 at %, $\Delta Vth_{10th-1E6}$ was 1.0 that was large, and the threshold voltage variation index was 0.36 that was large as compared with other experimental examples. In the experimental example 3-15 in which the content of the second element was 60 at %, the switch device did not operate. It is considered that the reason for this is that the content of the first element in the switch layer was too high. Thus, it was found that the second element is preferably included in a range from 3 at % to 50 at % both inclusive.

Next, attention is paid on the content of the third element selected from aluminum (Al), gallium (Ga), and indium (In). In the experimental example 3-1 in which the third element was not included, $\Delta Vth_{10th-1E6}$ was 0.4, and the threshold voltage variation index was 0.19, that is, threshold voltage variation was reduced as compared with the experimental example 1-1. In other words, it was found that the switch layer achieves the effects of the present disclosure with use of only the chalcogen element, the first element, and the second element. In contrast, in the experimental example 3-9 in which the content of the third element was 45 at %, the switch device did not operate. It is considered that the reason for this is that the content of the third element in the switch layer was too high. Thus, it was found that the third element is preferably included in a range from 0 at % to 40 at % both inclusive.

As described above, it is conceivable that the switch layer included in the switch device of the present disclosure preferably includes one or more kinds of chalcogen elements selected from tellurium (Te), selenium (Se), and sulfur (S) in a range from 20 at % to 70 at % both inclusive with a total of the elements excluding nitrogen (N) and oxygen (O) being 100. It is conceivable that one or more kinds of first elements selected from phosphorus (P) and arsenic (As) are preferably included in a range from 3 at % to 40 at % both inclusive. It is conceivable that one or more kinds of second elements selected from boron (B) and carbon (C) are preferably included in a range from 3 at % to 50 at % both inclusive. It is conceivable that one or more kinds of third elements selected from aluminum (Al), gallium (Ga), and indium (In) are preferably included in a range from 0 at % to 40 at % both inclusive.

Moreover, in the experimental examples 3-1 to 3-24, nitrogen (N) was added in a range from 3 at % to 30 at % both inclusive with respect to all the constituent elements. Further, although not shown here, in a switch device in which nitrogen (N) was added in a range of more than 30 at %, a malfunction, a characteristic defect, or film peeing of the switch layer easily occurred. Furthermore, as can be seen from the results in the experiment 2, nitrogen (N) may not necessarily be added. Hence, it is conceivable that nitrogen (N) with respect to all the constituent elements included in the switch layer is preferably included in a range of 30 at % or less, even though it is not sure that this applies to a switch device that includes a switch layer having composition ratios other than the compositions indicated in the experiment 3 or including any other additive element. Moreover, as can be seen from the results of the experiment 2, oxygen (O) may not necessarily be added. Further, it has been found that nitrogen (N) and oxygen (O) may be simultaneously added. Furthermore, although not shown here, in a case where oxygen (O) was added, in place of nitrogen (N), to the switch device having any of the elemental compositions described in the experimental examples 2 and 3 or in a case where both nitrogen (N) and oxygen (O) were added, if the content of oxygen (O) with respect to all the constituent elements included in the switch layer exceeded 30 at %, the switch layer had higher resistance, and characteristics as the switch device were not achieved. It is conceivable that oxygen (O) with respect to all the constituent elements included in the switch layer is preferably included in a range of 30 at % or less, even though it is not sure that this applies to the switch device that includes a switch layer having composition ratios other than the compositions indicated in the experiment 3 or including any other additive element.

Moreover, phosphorus (P) and arsenic (As) used as the first elements in the switch device of the present disclosure belong to the same group in the periodic table; however, arsenic (As) easily forms a compound with chalcogen elements of Group 16 as compared with phosphorus (P). Accordingly, it is presumed that an optimum composition ratio of arsenic (As) with respect to other elements included in the switch device is larger than that of the phosphorus (P). Thus, it is presumed that an optimum composition range that achieves preferable characteristics differs depending on a combination of the constituent elements.

For example, in the switch devices in the experimental examples 3-16 to 3-24, both $\Delta Vth_{10th-1E6}$ and the variation index had relatively favorable values. Accordingly, in the switch device of the present disclosure, it is presumable that the elemental compositions and the composition ranges in the experimental examples 3-16 to 3-24 are more preferable.

For example, it was found that in the switch device including BCGaPTeN that includes phosphorus (P) as the first element as in the experimental example 3-16, as composition ratios excluding nitrogen (N), the composition ratio of the chalcogen element is more preferably in a range from 45 at % to 55 at % both inclusive, the composition ratio of phosphorus (P) as the first element is more preferably in a range from 5 at % to 15 at % both inclusive, the total of the composition ratios of boron (B) and carbon (C) as the second elements is more preferably in a range from 20 at % to 30 at % both inclusive, and the composition ratio of gallium (Ga) as the third element is more preferably in a range from 8 at % to 18 at % both inclusive. It was found that the additive amount of nitrogen (N) is preferably in a range from 5 at % to 15 at % both inclusive with respect to all the constituent elements.

It was found that in the switch device including BCGaInPTeN that includes indium (In) as the third element in addition to gallium (Ga) as in the experimental example 3-17, characteristics such as repetitive operation are improved. It is presumable that the reason for this is that gallium (Ga) and indium (In) have the same valence and similar properties, but have different atomic (ionic) radii; therefore, adjusting the contents thereof makes it possible to further stabilize the amorphous structure. It was found that in the switch device having this elemental composition, as composition ratios excluding nitrogen (N), the composition ratio of the chalcogen element is more preferably in a range from 55 at % to 65 at % both inclusive, the composition ratio of phosphorus (P) as the first element is more preferably in a range from 8 at % to 18 at % both inclusive, the total of the composition ratios of boron (B) and carbon (C) as the second elements is more preferably in a range from 10 at % to 20 at % both inclusive, the composition ratio of gallium (Ga) as the third element is more preferably in a range from 5 at % to 20 at % both inclusive, and the composition ratio of indium (In) also as the third element is more preferably in a range from 5 at % to 20 at % both inclusive. It was found that the additive amount of nitrogen (N) is preferably in a range from 5 at % to 15 at % with respect to all the constituent elements.

Moreover, as can be seen from the results of the experimental examples 3-18 and 3-24, for example, the switch layer may be formed including, as another additive element, Si or Ge that forms a strong bond with B and C. Adding these elements possibly further stabilize the amorphous structure. Moreover, the switch layer may use nitrogen (N) and oxygen (O) simultaneously with silicon (Si) and germanium (Ge). Adding nitrogen (N) and oxygen (O) simultaneously with silicon (Si) and germanium (Ge) makes it possible to improve switch device characteristics such as reduction in leakage current simultaneously with repetition characteristics.

In the switch device including BCGaGePTeN that includes germanium (Ge) as the other element as in the experimental example 3-18, threshold voltage variation is reduced. It was found that in the switch device having this elemental composition, as composition ratios excluding nitrogen (N), the composition ratio of the chalcogen element is more preferably in a range from 50 at % to 60 at % both inclusive, the composition ratio of phosphorus (P) as the first element is more preferably in a range from 3 at % to 10 at % both inclusive, the total of the composition ratios of boron (B) and carbon (C) as the second elements is more preferably in a range from 20 at % to 30 at % both inclusive, the composition ratio of gallium (Ga) as the third element is more preferably in a range from 3 at % to 10 at % both inclusive, and the composition ratio of germanium (Ge) as the other element is more preferably in a range from 8 at % to 20 at % both inclusive. It was found that the additive amount of nitrogen (N) is preferably in a range from 3 at % to 10 at % both inclusive with respect to all the constituent elements.

It was found that in the switch device including BCGaAsTeN that uses arsenic (As) in place of phosphorus (P) as the first element as in the experimental example 3-19, in composition ratios excluding nitrogen, the composition ratio of the chalcogen element is more preferably in a range from 30 at % to 50 at % both inclusive, the composition ratio of arsenic (As) as the first element is more preferably in a range from 12 at % to 22 at % both inclusive, the total of the composition ratios of boron (B) and carbon (C) as the second elements is more preferably in a range from 15 at % to 35 at % both inclusive, and the composition ratio of gallium (Ga) as the third element is more preferably in a range from 15 at % to 25 at % both inclusive. It was found that the additive amount of nitrogen (N) is preferably in a range from 3 at % to 15 at % both inclusive with respect to all the constituent elements.

It was found that in the switch device including BCGaSiAsTeN to which silicon (Si) is added as the other element as in the experimental example 3-20, threshold voltage variation is reduced. It was found that in the switch device having this elemental composition, as composition ratios excluding nitrogen, the composition ratio of the chalcogen element is more preferably in a range from 25 at % to 35 at % both inclusive, the composition ratio of arsenic (As) as the first element is more preferably in a range from 12 at % to 22 at % both inclusive, the total of the composition ratios of boron (B) and carbon (C) as the second elements is preferably in a range from 17 at % to 27 at % both inclusive, the composition ratio of gallium (Ga) as the third element is more preferably in a range from 16 at % to 26 at % both inclusive, and the composition ratio of silicon (Si) as the other element is more preferably in a range from 5 at % to 15 at % both inclusive. It was found that the additive amount of nitrogen (N) is preferably in a range from 3 at % to 15 at % both inclusive with respect to all the constituent elements.

It was found that in the switch device including BCGaGeAsTeN to which germanium (Ge) is added as the other element as in the experimental example 3-21, threshold voltage variation is reduced. It was found that in the switch device having this elemental composition, as the composition ratios excluding nitrogen, the composition ratio of the chalcogen element is more preferably in a range from 25 at % to 35 at % both inclusive, the composition ratio of arsenic (As) as the first element is more preferably in a range from 15 at % to 25 at % both inclusive, the total of the composition ratios of boron (B) and carbon (C) as the second elements is more preferably in a range from 10 at % to 20 at % both inclusive, the composition ratio of gallium (Ga) as the third element is more preferably in a range from 20 at % to 30 at % both inclusive, and the composition ratio of germanium (Ge) as the other element is more preferably in a range from 8 at % to 20 at % both inclusive. It was found that the additive amount of nitrogen (N) is preferably in a range from 3 at % to 15 at % both inclusive with respect to all the constituent elements.

It was found that even in the switch device including ZnBCGaPTeN to which zinc (Zn) other than silicon (Si) and germanium (Ge) is added as the other element as in the experimental example 3-22, threshold voltage variation is reduced. It was found that in the switch device having this elemental composition, as the composition ratios excluding nitrogen, the composition ratio of the chalcogen element is more preferably in a range from 55 at % to 65 at % both inclusive, the composition ratio of phosphorus (P) as the first element is more preferably in a range from 5 at % to 15 at % both inclusive, the total of the composition ratios of boron (B) and carbon (C) as the second elements is more preferably in a range from 10 at % to 20 at % both inclusive, the composition ratio of gallium (Ga) as the third element is more preferably in a range from 5 at % to 15 at % both inclusive, and the composition ratio of zinc (Zn) as the other element is more preferably in a range from 5 at % to 15 at % both inclusive. It was found that the additive amount of nitrogen (N) is preferably in a range from 3 at % to 15 at % both inclusive with respect to all the constituent elements.

It was found that even in the switch device including BGaCAsSeN that includes selenium (Se) as the chalcogen element, arsenic (As) as the first element, and gallium (Ga) as the third element as in the experimental example 3-23, threshold voltage variation is reduced. It was found that in the switch device having this elemental composition, as composition ratios excluding nitrogen, the composition ratio of selenium (Se) as the chalcogen element is more preferably in a range from 20 at % to 70 at % both inclusive, the composition ratio of arsenic (As) as the first element is more preferably in a range from 3 at % to 40 at % both inclusive, the total of the composition ratios of boron (B) and carbon (C) as the second elements is more preferably in a range from 3 at % to 50 at % both inclusive, and the composition ratio of gallium (Ga) as the third element is more preferably in a range from 3 at % to 40 at % both inclusive. It was found that the additive amount of nitrogen (N) is preferably in a range from 0 at % to 30 at % both inclusive with respect to all the constituent elements. Moreover, the switch layer may include a composition such as BGaCSiAsSeN including silicon (Si) as in the experimental example 3-24. In this case, it was found that the composition ratio of silicon (Si) is preferably in a range from 3 at % to 20 at % both inclusive.

(Experiment 4)

First, a lower electrode including TiN was cleaned by reverse sputtering. Next, a switch layer including BCTeN was formed with a film thickness in a range from 5 nm to 50 nm on TiN by reactive sputtering while feeding nitrogen into a film formation chamber, and thereafter a film of W was formed with a film thickness of 30 nm to form an upper electrode. Thereafter, patterning, and heat treatment for two hours at 320° C. were performed to fabricate one transistor-one switch device (an experimental example 4-1). Table 4 illustrates constituent elements of the switch layer and a drift index to be described later in the experimental example 4-1.

TABLE 4

| Experimental Example | Switch Layer | Drift Index (V) |
|---|---|---|
| 4-1 | BCTeN | 0.50 |

It is known that the threshold voltage that causes switch operation of the switch device is affected by a length of time (interval time) from occurrence of the last switch operation (drift). In general, the threshold voltage in a subsequent switch operation tends to increase with an increase in the interval time from the last switch operation. As an ideal switch device, it is desirable that the threshold voltage be constantly fixed and not changed irrespective of the length of the interval time. Therefore, in order to evaluate the degree of increase in the threshold voltage together with the length of the interval time from the last switch operation, the "drift index" was defined and measured to evaluate the drift. Specifically, a pulse voltage was applied to the switch device to cause the switch device to reliably perform the switch operation (at a time of 0), and after a lapse of 100 ms (at a time of 100 ms) as the subsequent interval time, a pulse that causes the switch device to perform the switch operation again is applied to the switch device, and a change amount of the threshold voltage from the time of 0 was measured. The change mount of the threshold voltage is defined as the drift index. In the experimental example 4-1, the drift index was 0.50 V.

(Experiment 5)

Next, nine kinds of switch devices were fabricated with use of a method similar to that in the experiment 4 (experimental examples 5-1 to 5-9). Thereafter, drift indices thereof were measured similarly to the experimental example 4-1. Table 5 is a summary of the drift indices together with the compositions of the respective switch layers.

TABLE 5

| Experimental Example | Switch Layer | Drift Index (V) |
|---|---|---|
| 5-1 | B24-C6-As28-Te42-N | 0.22 |
| 5-2 | B24-C6-As28-Te42 | 0.25 |
| 5-3 | B30-As28-Se42-N | 0.16 |
| 5-4 | B12-C3-Ga5-As30-Se50-N | 0.04 |
| 5-5 | Ga25-As20-Se55 | 0.10 |
| 5-6 | Ga25-As20-Se55-N | 0.09 |
| 5-7 | Ga5-Ge12-As33-Se50 | 0.09 |
| 5-8 | Ga5-Ge12-As33-Se50-N | 0.08 |
| 5-9 | Ga5-Si12-As33-Se50-N | 0.06 |

As can be seen from Table 5, in the experimental examples 5-1 to 5-9, each of the drift indices was 0.25 or less, and a half or less of 0.50 V in the experimental example 4-1. The compositions of the switch layers in the experimental example 4-1 and the experimental example 5-1 differ in presence or absence of arsenic (As). In other words, it was found that the switch layer including an elemental composition that includes boron (B), carbon (C), arsenic (As), tellurium (Te), and nitrogen (N) makes it possible to reduce the drift. The experimental example 5-2 differs from the experimental example 5-1 in that nitrogen (N) is not included in the composition of the switch layer. The experimental example 5-3 differs from the experimental example 5-1 in that carbon (C) is not included in the composition of the switch layer and selenium (Se) is used in place of tellurium (Te). It was found from the results of the experimental examples 5-1 to 5-3 that the switch layer including an elemental composition that includes at least boron (B) or carbon (C), arsenic (As), and selenium (Se) or tellurium (Te) makes it possible to reduce the drift.

Moreover, in the experimental examples 5-4 to 5-9 in which gallium (Ga) was used, the drift index was further reduced. As seen from the results of the experimental example 5-5 and the experimental example 5-6, the drift index was reduced by a composition including at least gallium (Ga), arsenic (As), and selenium (Se). The experimental example 5-8 differs from the experimental example 5-6 in that germanium (Ge) is further added to the composition, and the experimental example 5-9 differs from the experimental example 5-8 in that silicon (Si) is added in place of germanium (Ge). In these experimental examples, the drift index was reduced as in the experimental example 5-6 and the experimental example 5-8. Moreover, although not shown here, in a composition including only AsSe or AsSeN, film floating, film peeling, etc. occurred after annealing after a process, and various characteristics including the drift index were largely deteriorated. Accordingly, it was found that the switch layer including the chalcogen element such as selenium (Se) and tellurium (Te), arsenic (As), and boron (B) or carbon (C) makes it possible to reduce the drift. Moreover, it was found that the switch layer including the chalcogen element such as selenium (Se) and tellurium (Te), arsenic (As), and gallium (Ga) makes it possible to largely reduce the drift.

It is conceivable that the drift is reduced by the following reason. For example, arsenic (As) forms chalcogenide glass with tellurium (Te) and selenium (Se) to form the chalcogenide glass. Moreover, arsenic (As) forms a compound, such as $As_2Te_3$ and $As_2Se_3$, having a higher melting point than that of the chalcogen elements. Accordingly, it is presumed that arsenic (As) has a strong interatomic bond with the chalcogen elements to stabilize the chalcogen elements. It is presumed that stability of the amorphous structure is thereby improved. Moreover, it is presumed that P (phosphorus) in the same group as arsenic (As) has similar properties. Accordingly, it is considered that the switch layer using arsenic (As) and gallium (Ga) together with the chalcogen elements makes it possible to achieve a stable amorphous structure that is resistant to structure change and atomic variation, and reduce temporal change in switching threshold voltage even in a case where an electric field associated with the switch device operation is applied to the switch layer.

Moreover, it is known that gallium (Ga) forms, for example, a stable compound such as GaP and GaAs with phosphorus (P) and arsenic (As). Further, the chalcogen elements and gallium (Ga) form, for example, a compound such as GaTe and $Ga_2Te_3$. Furthermore, arsenic (As) is easily bonded to the chalcogen elements. Accordingly, it is presumable that gallium (Ga), phosphorus (P) or arsenic (As), and the chalcogen elements are easily bonded to one another to form an amorphous structure. In other words, gallium (Ga) makes it possible to form a stable bond with not only the chalcogen elements but also pnictogen elements such as arsenic (As) and phosphorus (P), and form an amorphous structure. Accordingly, it is considered that the switch layer including gallium (Ga) simultaneously with the chalcogen elements and phosphorus (P) or arsenic (As) makes it possible to achieve a stable amorphous structure that is specifically resistant to structure change and atomic variation, and reduce temporal change in switching threshold voltage even in a case where an electric field associated with the switch device operation is applied.

It is to be noted that aluminum (Al) and indium (In) belonging to the same Group 13 in the periodic table as gallium (Ga) and having similar properties also form, for example, a compound such as AlAs and InP with phosphorus (P) and arsenic (As). Moreover, aluminum (Al) and indium (In) form, for example, a compound such as InTe with the chalcogen elements. This makes it possible to easily presume that similar effects are achievable even in a case where aluminum (Al) or indium (In) is used without limiting gallium (Ga). Moreover, it is presumed that similar effects are achievable even in a case where two or more kinds of elements of Group 13 in the periodic table selected from aluminum (Al), gallium (Ga), and indium (In) are used.

As described above, boron (B) and carbon (C) each have a small atomic radius as compared with phosphorus (P), arsenic (As), tellurium (Te), etc. as described above. Therefore, in the switch layer including boron (B) or carbon (C), phosphorus (P) or arsenic (As), and the chalcogen elements such as tellurium (Te), a difference between the atomic radius of boron (B) or carbon (C) and atomic radii of other elements is large, and the crystal structure is not easily formed accordingly. Accordingly, it is presumed that the switch layer including boron (B) or carbon (C), phosphorus (P) or arsenic (As), and the chalcogen elements such as tellurium (Te) has an amorphous structure further stabilized than the switch layer including phosphorus (P) or arsenic (As) and the chalcogen element such as tellurium (Te) without including boron (B) and carbon (C). Moreover, boron (B) and carbon (C) have a strong covalent property, and forms a covalent bond with the chalcogen elements in amorphous, thereby being stabilized. Accordingly, it is considered that using one or both of boron (B) and carbon (C) stabilizes the amorphous structure of the switch layer, which makes it possible to achieve a stable amorphous structure that is resistant to structure change and atomic variation, and reduces temporal change in switching threshold voltage even in a case where an electric field associated with the switch device operation is applied.

It is to be noted that switch characteristics of the switch device of the present disclosure is based on publicly known OTS characteristics by the chalcogen elements; therefore, it is easily presumed that similar effects are achievable even in a case where one kind or a plurality of kinds of chalcogen elements (selenium (Se) and sulfur (S)) excluding Te are used.

As described above, it is presumed that in a case where one or more kinds of chalcogen elements selected from tellurium (Te), selenium (Se) and sulfur (S), one or more kinds of first elements selected from phosphorus (P) and arsenic (As), and one or more kinds of third elements selected from aluminum (Al), gallium (Ga), and indium (In) are used, these elements are uniformly mixed to form a mutually stable bond, thereby obtaining a stable amorphous structure having an increased melting point and an increased crystallization temperature. In other words, it is considered that including the above-described elemental composition makes it possible to achieve the switch layer having a stable amorphous structure that is specifically resistant to structure change and atomic variation by these compositions, and reduce temporal change in switching threshold voltage even in a case where an electric field associated with the switch device operation is applied.

Moreover, in the switch layer, nitrogen (N) or oxygen (O) may be added to the above-described constituent elements. It is considered that nitrogen (N) and oxygen (O) are bonded to the constituent elements, thereby contributing to stabilization of the amorphous structure. It is considered that nitrogen (N) and oxygen (O) make it possible to achieve a stable amorphous structure that is resistant to structure change and atomic variation, and reduce the drift that is temporal change in the switching threshold voltage even in a case where an electric field associated with the switch device operation is applied.

Further, silicon (Si) and germanium (Ge) may be further added to the switch layer as additive elements. Adding these elements may possibly further stabilize the amorphous structure. Furthermore, the switch layer may use nitrogen (N) and oxygen (O) simultaneously with silicon (Si) and germanium (Ge). It is considered that adding nitrogen (N) and oxygen (O) simultaneously with silicon (Si) and germanium (Ge) makes it possible to achieve a stable amorphous structure that is resistant to structure change and atomic variation, and reduce the drift that is temporal change in the switching threshold voltage even in a case where an electric field associated with the switch device operation is applied.

Moreover, it was found from the results of the experiments 3 and 5 and results of measurement of the drift indices of switch devices including the same elemental composition with various composition ratios that are not specifically described here that in a case where the composition ratio of the chalcogen element is 20 at % or less, the chalcogen element necessary for the switch operation is insufficient to perform the switch operation. Further, it was found that in a case where the composition ratio of the chalcogen element is 70 at % or more, film quality is deteriorated to cause film peeling during the process. Furthermore, in a case where the content of the first element was 3 at % or less, the drift index was deteriorated by shortage of the first element, and in a case where the content of the first element was 40 at % or more, the content ratio of the first element was too high, thereby causing a malfunction. Likewise, in a case where the content of the third element was 3 at % or less, the drift index was deteriorated by shortage of the third element, and in a case where the content of the third element was 40 at % or more, the content ratio of the third element was too high, thereby causing a malfunction. Accordingly, it was found that the switch layer 22 preferably includes the chalcogen element in a range from 20 at % to 70 at % both inclusive, and preferably includes the first element in a range from 3 at % to 40 at % both inclusive. It was found that the switch layer 22 preferably includes the third element in a range from 3 at % to 40 at % both inclusive.

Moreover, as can be seen from the result of the experimental example 5-4, a more preferable elemental composition of the switch device is, for example, BGaCAsSeN. It is presumed that with this elemental composition, the amorphous structure is further stabilized and a large effect of reducing the drift is achieved. Although specific experimental results are not shown here, it was found that in the above-described elemental composition, a composition range of selenium (Se) as the chalcogen element is preferably from 40 at % to 60 at % both inclusive, a composition range of arsenic (As) as the first element is preferably from 30 at % to 40 at % both inclusive, a composition range of gallium (Ga) as the third element is preferably from 3 at % to 10 at % both inclusive, and composition ranges of boron (B) and carbon (C) are preferably from 3 at % to 15 at % both inclusive. Further, it was found that the additive amount of nitrogen (N) is preferably in a range from 5 at % to 20 at % both inclusive with respect to all the constituent elements.

Likewise, as can be seen from the result of the experimental example 5-6, a more preferable elemental composition of the switch device is, for example, GaGeAsSeN. Although specific experimental results are not shown here, it was found that in the above-described elemental composition, a composition range of selenium (Se) as the chalcogen element is preferably from 40 at % to 60 at % both inclusive, a composition range of arsenic (As) as the first element is preferably from 20 at % to 40 at % both inclusive, a composition range of gallium (Ga) as the third element is preferably from 3 at % to 10 at % both inclusive, and a composition range of germanium (Ge) is preferably from 5 at % to 15 at % both inclusive. Further, it was found that the additive amount of nitrogen (N) is preferably in a range from 5 at % to 20 at % both inclusive with respect to all the constituent elements.

Furthermore, as described above, it was found that including, as the constituent elements of the switch layer, one or more kinds of chalcogen elements selected from tellurium (Te), selenium (Se), and sulfur (S), one or more kinds of first elements selected from phosphorus (P) and arsenic (As), and one or more kinds of second elements selected from boron (B) and carbon (C) makes it possible to reduce threshold voltage variation in the repetitive operation. In addition, it was found that including, as the constituent elements of the switch layer, one or more kinds of chalcogen elements selected from tellurium (Te), selenium (Se), and sulfur (S), one or more kinds of first elements selected from phosphorus (P) and arsenic (As), and one or more kinds of third elements selected from aluminum (Al), gallium (Ga), and indium (In) makes it possible to reduce the drift and reduce threshold voltage variation between devices. Accordingly, it is easily presumable that as in the experimental example 5-3 in the experiment 5, including the chalcogen element, the first element, the second element, and the third element makes it possible to reduce both the threshold voltage variation in the repetitive operation and threshold voltage variation between devices by reduction in the drift.

Although the description has been given with reference to the first to third embodiments and the modification examples thereof, the content of the present disclosure is not limited to the foregoing embodiments, etc., and may be modified in a variety of ways. It is to be noted that the effects described in the present specification are merely illustrative. Effects achieved by the present disclosure are not limited to the effects described in the present specification. The contents of the present disclosure may have effects other than the effects described in the present specification.

In addition, for example, the present disclosure may have the following configurations.

(1)

A switch device including:

a first electrode;

a second electrode opposed to the first electrode; and a switch layer provided between the first electrode and the second electrode, the switch layer including one or more kinds of chalcogen elements selected from tellurium (Te), selenium (Se), and sulfur (S) and one or more kinds of first elements selected from phosphorus (P) and arsenic (As), and further including one or both of one or more kinds of second elements selected from boron (B) and carbon (C) and one or more kinds of third elements selected from aluminum (Al), gallium (Ga), and indium (In).

(2)

The switch device according to (1), in which without involving phase change between an amorphous phase and a crystal phase, the switch layer is changed to a low-resistance state by an increase in an application voltage to a predetermined threshold voltage or higher, and is changed to a high-resistance state by a decrease in the application voltage to a voltage that is lower than the threshold voltage.

(3)

The switch device according to (1) or (2), in which the switch layer includes the chalcogen element in a range from 20 at % to 70 at % both inclusive, the first element in a range from 3 at % to 40 at % both inclusive, and one or both of the second element and the third element in a range of 3 at % or more.

(4)

The switch device according to (3), in which in a case where the switch layer includes the second element, an upper limit of a content of the second element is 50 at % or less.

(5)

The switch device according to (3), in which in a case where the switch layer includes the third element, an upper limit of a content of the third element is 40 at % or less.

(6)

The switch device according to any one of (1) to (5), in which the switch layer further includes one or both of nitrogen (N) and oxygen (O).

(7)

The switch device according to any one of (1) to (6), in which in a case where a total of composition ratios excluding nitrogen (N) or oxygen (O) is 100 at %, the switch layer includes the chalcogen element in a range from 20 at % to 70 at % both inclusive, the first element in a range from 3 at % to 40 at % both inclusive, and one or both of the second element and the third element in a range of 3 at % or more.

(8)

The switch device according to (7), in which in a case where the switch layer includes the second element, an upper limit of a content of the second element is 50 at % or less.

(9)

The switch device according to (7), in which in a case where the switch layer includes the third element, an upper limit of a content of the third element is 40 at % or less.

(10)

The switch device according to any one of (1) to (9), in which the switch layer includes any one of compositions of BAsTe, BAsTeN, BAsTeO, BCAsTe, BCAsTeN, BCAsTeO, BPAsTe, BPAsTeN, BPAsTeO, BCPAsTe, BCPAsTeN, BCPAsTeO, BAsSe, BAsSeN, BAsSeO, BCAsSe, BCAsSeN, BCAsSeO, BPAsSe, BPAsSeN, BPAsSeO, BCPAsSe, BCPAsSeN, and BCPAsSeO.

(11)

The switch device according to any one of (1) to (9), in which the switch layer includes any one of compositions of BGaPTe, BGaAsTe, BGaPTeN, BGaAsTeN, BGaPTeO, BGaAsTeO, BGaCPTe, BGaCAsTe, BGaCPTeN, BGaCAsTeN, BGaCPTeO, BGaCAsTeO, BGaPSe, BGaAsSe, BGaPSeN, BGaAsSeN, BGaPSeO, BGaAsSeO, BGaCPSe, BGaCAsSe, BGaCPSeN, BGaCAsSeN, BGaCPSeO, and BGaCAsSeO.

(12)

The switch device according to any one of (1) to (9), in which the switch layer includes any one of compositions of BAlGaPTe, BAlGaAsTe, BAlGaPTeN, BAlGaAsTeN, BAlGaPTeO, BAlGaAsTeO, BAlGaCPTe, BAlGaCAsTe, BAlGaCPTeN, BAlGaCAsTeN, BAlGaCPTeO, BAlGaCAsTeO, BAlGaPSe, BAlGaAsSe, BAlGaPSeN, BAlGaAsSeN, BAlGaPSeO, BAlGaAsSeO, BAlGaCPSe, BAlGaCAsSe, BAlGaCPSeN, BAlGaCAsSeN, BAlGaCPSeO, and BAlGaCAsSeO.

(13)

The switch device according to any one of (1) to (9), in which the switch layer includes any one of compositions of BGaInPTe, BGaInAsTe, BGaInPTeN, BGaInAsTeN, BGaInPTeO, BGaInAsTeO, BGaInCPTe, BGaInCAsTe, BGaInCPTeN, BGaInCAsTeN, BGaInCPTeO, BGaInCAsTeO, BGaInPSe, BGaInAsSe, BGaInPSeN, BGaInAsSeN, BGaInPSeO, BGaInAsSeO, BGaInCPSe, BGaInCAsSe, BGaInCPSeN, BGaInCAsSeN, BGaInCPSeO, and BGaInCAsSeO.

(14)

The switch device according to any one of (1) to (9), in which the switch layer includes any one of compositions of GaPTe, GaPSe, GaPTeO, GaPSeO, GaPTeN, GaPSeN, AlAsTe, AlAsSe, GaAsTe, GaAsSe, AlAsTeO, AlAsSeO, GaAsTeO, GaAsSeO, AlAsTeN, AlAsSeN, GaAsTeN, GaAsSeN, GaGeAsTe, GaGeAsSe, GaGeAsTeO, GaGeAsSeO, GaGeAsTeN, GaGeAsSeN, GaSiAsTe, GaSiAsSe, GaSiAsTeO, GaSiAsSeO, GaSiAsTeN, and GaSiAsSeN.

(15)

The switch device according to any one of (1) to (14), in which the switch layer includes one or both of silicon (Si) and germanium (Ge).

(16)

A storage apparatus provided with a plurality of memory cells, each of the memory cells including a memory device and a switch device directly coupled to the memory device, the switch device including:
a first electrode;
a second electrode opposed to the first electrode; and
a switch layer provided between the first electrode and the second electrode,
the switch layer including one or more kinds of chalcogen elements selected from tellurium (Te), selenium (Se), and sulfur (S) and one or more kinds of first elements selected from phosphorus (P) and arsenic (As), and further including one or both of one or more kinds of second elements selected from boron (B) and carbon (C) and one or more kinds of third elements selected from aluminum (Al), gallium (Ga), and indium (In).

(17)

The storage apparatus according to (16), in which the memory device includes any one of a phase-change memory device, a resistance-change memory device, and a magnetoresistive memory device.

(18)

The storage apparatus according to (16) or (17), in which two or more of the plurality of memory cells are stacked.

(19)

A memory system provided with a host computer, a memory, and a memory controller, the host computer including a processor, the memory including a memory cell array that includes a plurality of memory cell, the memory controller that performs control of a request to the memory in accordance with a command from the host computer, each of the plurality of memory cells including a memory device and a switch device directly coupled to the memory device, the switch device including:
a first electrode;
a second electrode opposed to the first electrode; and
a switch layer provided between the first electrode and the second electrode,
the switch layer including one or more kinds of chalcogen elements selected from tellurium (Te), selenium (Se), and sulfur (S) and one or more kinds of first elements selected from phosphorus (P) and arsenic (As), and further including one or both of one or more kinds of second elements selected from boron (B) and carbon (C) and one or more kinds of third elements selected from aluminum (Al), gallium (Ga), and indium (In).

REFERENCE SIGNS LIST 1 to 6 memory cell array
10 memory cell
20 switch device
21 lower electrode
22 switch layer
23, 32 upper electrode
24 high-resistance layer
30 memory device
31 memory layer
31A ion source layer
31B resistance change layer
41 intermediate electrode
BL bit line
RM read margin
WL word line
$\Delta V_{th1}$ threshold voltage variation of switch device
$\Delta V_{th2}$ threshold voltage variation of memory device

The invention claimed is:
1. A switch device, comprising:
a first electrode;
a second electrode opposed to the first electrode;
a switch layer between the first electrode and the second electrode, wherein the switch layer includes a first layer and a second layer,
a composition of a plurality of elements in the first layer is different from a composition of the plurality of elements in the second layer, and
the plurality of elements comprises:
a plurality of kinds of chalcogen elements selected from at least one of tellurium (Te), selenium (Se), or sulfur (S);
a plurality of kinds of first elements selected from at least one of phosphorus (P) or arsenic (As); and
at least one of
a plurality of kinds of second elements selected from at least one of boron (B) or carbon (C); or
a plurality of kinds of third elements selected from at least one of aluminum (Al), gallium (Ga), or indium (In);
a first high-resistance layer between the first electrode and the switch layer; and
a second high-resistance layer on a side of the second electrode, wherein the switch layer is between the first high-resistance layer and the second high-resistance layer.

2. The switch device according to claim 1, wherein without involving phase change between an amorphous phase and a crystal phase,
the switch layer is changed to a low-resistance state based on an increase in an application voltage to at least a threshold voltage, and
the switch layer is changed to a high-resistance state based on a decrease in the application voltage to the application voltage that is lower than the threshold voltage.

3. The switch device according to claim 1, wherein the switch layer further includes:
a chalcogen element of the plurality of kinds of chalcogen elements in a range from 20% to 70%;
a first element of the plurality of kinds of first elements is in a range from 3% to 40%; and
at least one of a second element of the plurality of kinds of second elements or a third element of the plurality of kinds of third elements is in a range of at least 3%.

4. The switch device according to claim 3, wherein when the switch layer includes the second element, an upper limit of a content of the second element is 50% or less.

5. The switch device according to claim 3, wherein when the switch layer includes the third element, an upper limit of a content of the third element is 40% or less.

6. The switch device according to claim 1, wherein the switch layer further includes at least one of nitrogen (N) or oxygen (O).

7. The switch device according to claim 1, wherein
when a total of composition ratios of the plurality of elements, excluding at least one of nitrogen (N) or oxygen (O), is 100%,
the switch layer includes a chalcogen element of the plurality of kinds of chalcogen elements in a range from 20% to 70%,
a first element of the plurality of kinds of first elements is in a range from 3% to 40%, and
at least one of a second element of the plurality of kinds of second elements or a third element of the plurality of kinds of third elements is in a range of at least 3%.

8. The switch device according to claim 7, wherein when the switch layer includes the second element, an upper limit of a content of the second element is 50% or less.

9. The switch device according to claim 7, wherein when the switch layer includes the third element, an upper limit of a content of the third element is 40% or less.

10. The switch device according to claim 1, wherein the switch layer further includes one of compositions of BAsTe, BAsTeN, BAsTeO, BCAsTe, BCAsTeN, BCAsTeO, BPAsTe, BPAsTeN, BPAsTeO, BCPAsTe, BCPAsTeN, BCPAsTeO, BAsSe, BAsSeN, BAsSeO, BCAsSe, BCAsSeN, BCAsSeO, BPAsSe, BPAsSeN, BPAsSeO, BCPAsSe, BCPAsSeN, or BCPAsSeO.

11. The switch device according to claim 1, wherein the switch layer further includes one of compositions of BGaPTe, BGaAsTe, BGaPTeN, BGaAsTeN, BGaPTeO, BGaAsTeO, BGaCPTe, BGaCAsTe, BGaCPTeN, BGaCAsTeN, BGaCPTeO, BGaCAsTeO, BGaPSe, BGaAsSe, BGaPSeN, BGaAsSeN, BGaPSeO, BGaAsSeO, BGaCPSe, BGaCAsSe, BGaCPSeN, BGaCAsSeN, BGaCPSeO, or BGaCAsSeO.

12. The switch device according to claim 1, wherein the switch layer further includes one of compositions of BAlGaPTe, BAlGaAsTe, BAlGaPTeN, BAlGaAsTeN, BAlGaPTeO, BAlGaAsTeO, BAlGaCPTe, BAlGaCAsTe, BAlGaCPTeN, BAlGaCAsTeN, BAlGaCPTeO, BAlGaCAsTeO, BAlGaPSe, BAlGaAsSe, BAlGaPSeN, BAlGaAsSeN, BAlGaPSeO, BAlGaAsSeO, BAlGaCPSe, BAlGaCAsSe, BAlGaCPSeN, BAlGaCAsSeN, BAlGaCPSeO, or BAlGaCAsSeO.

13. The switch device according to claim 1, wherein the switch layer further includes one of compositions of BGaInPTe, BGaInAsTe, BGaInPTeN, BGaInAsTeN, BGaInPTeO, BGaInAsTeO, BGaInCPTe, BGaInCAsTe, BGaInCPTeN, BGaInCAsTeN, BGaInCPTeO, BGaInCAsTeO, BGaInPSe, BGaInAsSe, BGaInPSeN, BGaInAsSeN, BGaInPSeO, BGaInAsSeO, BGaInCPSe, BGaInCAsSe, BGaInCPSeN, BGaInCAsSeN, BGaInCPSeO, or BGaInCAsSeO.

14. The switch device according to claim 1, wherein the switch layer further includes one of compositions of GaPTe, GaPSe, GaPTeO, GaPSeO, GaPTeN, GaPSeN, AlAsTe, AlAsSe, GaAsTe, GaAsSe, AlAsTeO, AlAsSeO, GaAsTeO, GaAsSeO, AlAsTeN, AlAsSeN, GaAsTeN, GaAsSeN, GaGeAsTe, GaGeAsSe, GaGeAsTeO, GaGeAsSeO, GaGeAsTeN, GaGeAsSeN, GaSiAsTe, GaSiAsSe, GaSiAsTeO, GaSiAsSeO, GaSiAsTeN, or GaSiAsSeN.

15. The switch device according to claim 1, wherein the switch layer further includes at least one of silicon (Si) or germanium (Ge).

16. A storage apparatus, comprising:
a plurality of memory cells, wherein each of the plurality of memory cells comprises:
a memory device; and
a switch device directly coupled to the memory device, wherein the switch device comprises:
a first electrode;
a second electrode opposed to the first electrode; and
a switch layer between the first electrode and the second electrode, wherein
the switch layer includes a first layer and a second layer,
a composition of a plurality of elements in the first layer is different from a composition of the plurality of elements in the second layer, and
the plurality of elements comprises:
a plurality of kinds of chalcogen elements selected from at least one of tellurium (Te), selenium (Se), or sulfur (S);

a plurality of kinds of first elements selected from at least one of phosphorus (P) or arsenic (As); and at least one of
a plurality of kinds of second elements selected from at least one of boron (B) or carbon (C); or
a plurality of kinds of third elements selected from at least one of aluminum (Al), gallium (Ga), or indium (In);

a first high-resistance layer between the first electrode and the switch layer; and a second high-resistance layer on a side of the second electrode, wherein the switch layer is between the first high-resistance layer and the second high-resistance layer.

17. The storage apparatus according to claim 16, wherein the memory device includes one of a phase-change memory device, a resistance-change memory device, or a magnetoresistive memory device.

18. The storage apparatus according to claim 16, wherein at least two of the plurality of memory cells are stacked.

19. A memory system, comprising:
a host computer,
a memory, and
a memory controller, wherein
the host computer comprises a processor,
the memory comprises a memory cell array that includes a plurality of memory cells, wherein
the memory controller is configured to control a request to the memory based on a command from the host computer,
each of the plurality of memory cells comprises:
a memory device; and
a switch device directly coupled to the memory device, wherein the switch device comprises:
a first electrode;
a second electrode opposed to the first electrode; and
a switch layer between the first electrode and the second electrode, wherein
the switch layer includes a first layer and a second layer,
a composition of a plurality of elements in the first layer is different from a composition of the plurality of elements in the second layer, and
the plurality of elements comprises:
a plurality of kinds of chalcogen elements selected from at least one of tellurium (Te), selenium (Se), or sulfur (S);
a plurality of kinds of first elements selected from at least one of phosphorus (P) or arsenic (As); and
at least one of
a plurality of kinds of second elements selected from at least one of boron (B) or carbon (C); or
a plurality of kinds of third elements selected from at least one of aluminum (Al), gallium (Ga), or indium (In);
a first high-resistance layer between the first electrode and the switch layer; and
a second high-resistance layer on a side of the second electrode, wherein the switch layer is between the first high-resistance layer and the second high-resistance layer.

* * * * *